(12) United States Patent
Kappauf et al.

(10) Patent No.: US 7,769,558 B2
(45) Date of Patent: Aug. 3, 2010

(54) DIGITAL WAVEFORM GENERATION AND MEASUREMENT IN AUTOMATED TEST EQUIPMENT

(75) Inventors: William F. Kappauf, Spokane, WA (US); Barry E. Blancha, Boxborough, MA (US); Tetsuro Nakao, Kagoshima (JP)

(73) Assignee: Asterion, Inc., Marlborough, MA (US)

(*) Notice: Subject to any disclaimer, the term of this patent is extended or adjusted under 35 U.S.C. 154(b) by 87 days.

(21) Appl. No.: 11/827,141

(22) Filed: Jul. 10, 2007

(65) Prior Publication Data
US 2008/0114563 A1   May 15, 2008

Related U.S. Application Data

(60) Provisional application No. 60/819,772, filed on Jul. 10, 2006.

(51) Int. Cl.
G01M 19/00 (2006.01)
G06F 11/00 (2006.01)

(52) U.S. Cl. .......................... 702/124; 326/38; 714/736

(58) Field of Classification Search .................. 702/124, 702/125, 126; 714/36, 733, 740, 742, 736; 324/751, 752, 763; 326/38
See application file for complete search history.

(56) References Cited

U.S. PATENT DOCUMENTS

| | | | |
|---|---|---|---|
| 5,668,819 A * | 9/1997 | Fukushima ................. 714/736 |
| 6,658,363 B2 * | 12/2003 | Mejia et al. ................. 702/125 |
| 6,687,868 B1 | 2/2004 | Furukawa | |
| 7,368,939 B2 * | 5/2008 | Ito et al. ....................... 326/38 |
| 2005/0283697 A1 | 12/2005 | Kang et al. | |
| 2006/0107151 A1 | 5/2006 | Mushirabad et al. | |

* cited by examiner

Primary Examiner—John H Le
(74) Attorney, Agent, or Firm—Lando & Anastasi, LLP

(57) ABSTRACT

A waveform generation and measurement module that may be used in automated test equipment. The waveform generation and measurement module includes high speed SERDES (or other shift registers) that are used to digitally draw a test waveform. Additional high speed SERDES may also be used to receive (in serial form) a response waveform from a device under test and convert it to parallel data for high speed processing. The waveform generation and measurement module may be implemented in field programmable gate array logic.

19 Claims, 19 Drawing Sheets

FIG. 14

| Compare | Expect | STB | CPH | CPL | DUT | SPH | SPL | FAIL |
|---|---|---|---|---|---|---|---|---|
| | X | 0 | X | X | X | X | X | Pass |
| | V | 1 | 0 | 0 | ZZ | 0 | 0 | ZZ |
| | V | 1 | 0 | 0 | H | 0 | 1 | Pass |
| | V | 1 | 0 | 0 | L | 1 | 0 | Pass |
| | V | 1 | 0 | 0 | Z | 1 | 1 | N |
| | L | 1 | 0 | 1 | ZZ | 0 | 0 | Pass |
| | L | 1 | 0 | 1 | H | 0 | 1 | H |
| | L | 1 | 0 | 1 | L | 1 | 0 | Pass |
| | L | 1 | 0 | 1 | Z | 1 | 1 | N |
| | H | 1 | 1 | 0 | ZZ | 0 | 0 | Pass |
| | H | 1 | 1 | 0 | H | 0 | 1 | Pass |
| | H | 1 | 1 | 0 | L | 1 | 0 | L |
| | H | 1 | 1 | 0 | Z | 1 | 1 | N |
| | Z | 1 | 1 | 1 | ZZ | 0 | 0 | Pass |
| | Z | 1 | 1 | 1 | H | 0 | 1 | H |
| | Z | 1 | 1 | 1 | L | 1 | 0 | L |
| | Z | 1 | 1 | 1 | Z | 1 | 1 | Pass |

| SPH | | SPL | |
|---|---|---|---|
| 0 | DUT>VOH | 0 | DUT<VOL |
| 0 | DUT>VOH | 1 | DUT>VOL |
| 1 | DUT<VOH | 0 | DUT<VOL |
| 1 | DUT<VOH | 1 | DUT>VOL |

| SPH | SPL | DUT |
|---|---|---|
| 0 | 0 | ZZ |
| 1 | 0 | H |
| 0 | 1 | L |
| 1 | 1 | Z |

DIGITAL WAVEFORM GENERATION AND MEASUREMENT IN AUTOMATED TEST EQUIPMENT

CROSS-REFERENCE TO RELATED APPLICATIONS

This application claims priority under 35 U.S.C. §119(e) to U.S. Provisional Patent Application No. 60/819,772 entitled "DIGITAL WAVEFORM GENERATION IN AUTOMATED TEST EQUIPMENT," and filed Jul. 10, 2006, which is herein incorporated by reference in its entirety.

BACKGROUND

1. Field of Invention

At least one embodiment of the invention relates to automated test equipment and, more particularly, to a system and method of waveform generation and measurement in such equipment.

2. Discussion of Related Art

Today, many semiconductor integrated circuits are highly complex and require sophisticated automated test equipment (ATE) to test for manufacturing defects. Generally, ATE is used to test integrated circuits (ICs) by applying test patterns stored in the ATE memory to the IC under test and comparing the chip response to the expected response. These test patterns typically involve waveform and timing generation via an application specific integrated circuit (ASIC). Drawbacks to ASICs include expense and time to produce, and cost to revise for bug fixes and future enhancements. This increases the cost of the ATE, which is already typically very high due to the need for complex, high performance computing equipment to carry out the testing.

Despite the sometimes prohibitive cost of ATE, they are essential to many companies. Testing of each manufactured integrated circuit before it is shipped to a customer is important because a significant percentage of fabricated integrated circuits contain manufacturing defects, especially in case of large-scale integrated circuits. Therefore, it is important to screen out these defective chips before they are shipped to a customer. Thus, it would be desirable to provide an ATE that includes off-the-shelf components and systems so as to reduce cost and allow for migration to higher performance options as the component technology advances.

SUMMARY OF INVENTION

Aspects and embodiments of the invention are directed to a digital module for waveform and timing generation in an ATE. High speed shift registers, such as serializer-deserializer components (SERDES), may be used to digitally draw a test waveform by receiving parallel input data from a memory device on the digital module and converting it to a very high speed serial waveform to stimulate a pin to which a device under test (referred to herein as a "DUT") may be coupled. Improved jitter and linearity may be achieved compared to conventional waveform generation because the SERDES propagation delay is constant. In addition, high speed shift registers may also be used to receive (in serial form) a response waveform from a DUT and convert it to parallel data for high speed processing. Because the received waveform that may be used to analyze the response of the DUT includes a large number of samples, considerably more detail may be captured in the waveform and thus a single waveform may be used to perform multiple tests on the DUT in a single test cycle. Thus, by digitally drawing the desired stimulus waveform using the shift registers, and processing the expected or measured waveform, enhanced functionality may be achieved. Furthermore, a digital module according to the invention may be implemented in an FPGA, which may be significantly more flexible and have a far lower development cost than an ASIC used in conventional ATE. Thus, a digital module according to aspects of the invention may facilitate development of ATE that is low cost, scalable and supports quick prototyping of new measurement solutions.

According to one embodiment, a waveform generation and measurement module in automated test equipment may comprise a memory device that contains vector information characterizing a test waveform, a first plurality of shift registers that receive the vector information from the memory device in parallel format and produce a serial output corresponding to the test waveform, and a second plurality of shift registers that receive in serial format a response waveform from a device under test and produce as an output, parallel data corresponding to the response waveform.

In one example, the first and second plurality of shift registers each comprises at least one serializer/deserializer component. In another example, the test waveform may be defined as a plurality of TICs, each TIC corresponding to at least one bit position within the test waveform. In one example, each TIC may have a duration that is greater than or equal to one clock cycle of the serializer/deserializer component. The waveform generation and measurement module may further comprise a data combiner. In one example, the data combiner may be constructed and arranged to receive pattern data from the memory device, and to combine the pattern data with the vector information characterizing the test waveform to produce the test waveform. In another example, the vector information may specify a vector period, and the waveform generation and measurement module may comprise a period generator constructed and arranged to generate the vector period. The waveform generation and measurement module may further comprise a waveform stretch circuit that is constructed and arranged to replicate each TIC, such that each TIC has a duration that is at least two clock cycles of the serializer/deserializer component. In another example, the memory device may contain compare vector information characterizing a compare waveform. The waveform generation and measurement module may comprise a fail detect circuit that receives the compare waveform and the response waveform and is constructed and arranged to compare the response waveform with the compare waveform, bit by bit. The fail detect circuit may be constructed and arranged to generate a fail record based on the comparison of the response waveform with the compare waveform. In one example, the waveform generation and measurement module may comprise a fail buffer to receive and store the fail record. In some examples, the waveform generation and measurement module may be implemented as a field programmable gate array.

According to another embodiment, a method of waveform generation in automated test equipment may comprise providing digital data in a parallel format to a first plurality of shift registers, and serially shifting out the digital data from the first plurality of shift registers to produce a test waveform.

In one example, providing the digital data may include providing a digital waveform comprising a plurality of TICs, each TIC having a duration that is equal to at least one shift register clock cycle. In another example, the method may further comprise stretching the digital waveform such that each TIC has a duration that is equal to at least two shift register clock cycles. In some examples, the method may further comprise receiving with a second plurality of shift registers a response waveform in serial format, and converting the response waveform to parallel format output data. The method may also comprise comparing the output data to a compare waveform, and generating fail data based on the comparing, and (optionally) storing the fail data. In one example, the comparing may include performing a bit by bit comparison.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures:

FIG. 14 is a table and circuit diagram of one embodiment of a fail detector circuit and fail data encoding, according to aspects of the invention;

DETAILED DESCRIPTION

Figure 1:
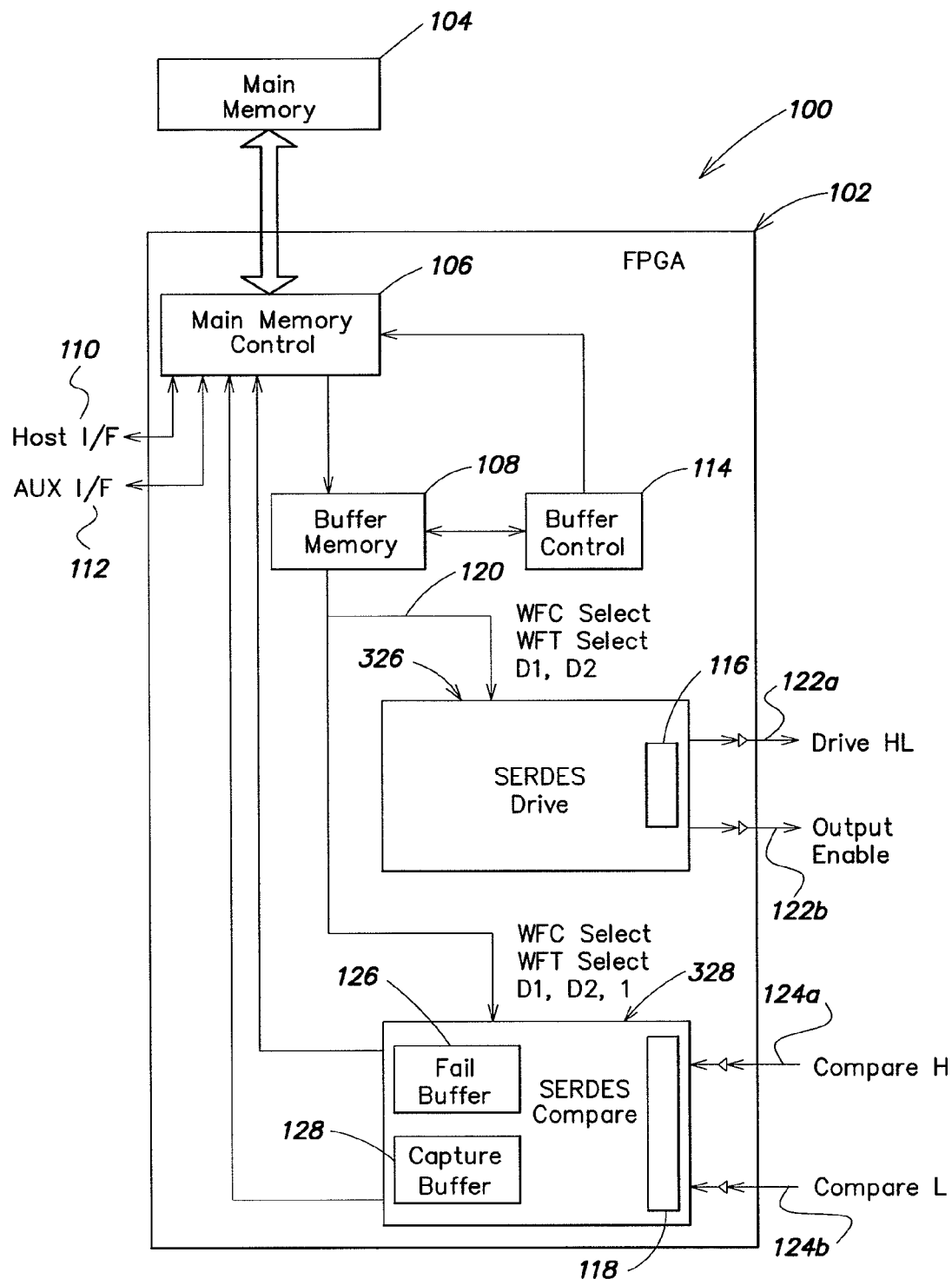
FIG. 1 is a block diagram of one embodiment of a digital module according to aspects of the invention.

At least some aspects and embodiments of the invention are directed to a module that may provide waveform or timing generation and measurement for automated test equipment (ATE). As discussed above, conventional ATE may be very expensive due to the need for custom-made, complex circuitry and computing components. According to embodiments and aspects of the invention, there is provided a waveform generation module that may replace the application specific integrated circuits (ASICs) typically used in conventional ATE with more flexible and inexpensive field programmable gate array (FPGA) technology. In particular, at least some aspects and embodiments are directed to an FPGA based timing generator using high speed serializer-deserializer (SERDES) input and output channels, as discussed below. Using FPGA technology may significantly reduce the cost of ATE by eliminating the huge non-recoverable development cost typically associated with ASIC designs, and may also provide enhanced functionality and flexibility, as discussed further below.

It is to be appreciated that embodiments of the methods and apparatus discussed herein are not limited in application to the details of construction and the arrangement of components set forth in the following description or illustrated in the accompanying drawings. The methods and apparatus are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

The following abbreviations are used throughout this specification:

STIL Standard Test Interface Language, as defined by IEEE 1450;

DUT Device Under Test;

ATE Automated Test Equipment;

FPGA Field Programmable Gate Array;

ASIC Application Specific Integrated Circuit.

T Vector period;

$T_0$ The starting point of a vector period;

$T_C$ system clock period;

$T_S$ SERDES clock period;

TIC the smallest piece of a given waveform at a given frequency;

WFC Waveform Character;

WFM Waveform Memory;

WFT Waveform Table;

BL Burst Length;

WS WaveSet;

WGL Waveform Generation Language;

PE Pin Electronics.

ATE comprises a circuitry to which a device under test (DUT), for example, a semiconductor integrated circuit, may be connected. The circuitry may supply a test waveform to the DUT and measure a response from the DUT to determine whether the DUT is operating correctly. In some ATE, a test head is included to provide these functions. In other ATE, the signals are supplied from instruments within the mainframe of the ATE. According to one embodiment, there is provided a digital module that may be connected to the ATE circuitry to supply the test waveform and to analyze the response waveform from the DUT. This digital module may be implemented in large part as an FPGA to achieve the above-discussed benefits of lower development cost and increased flexibility.

Referring to FIG. 1, there is illustrated a block diagram of one example of a portion of a digital module according to aspects of the invention. The digital module 100 may include a main memory 104 that contains information specifying a desired waveform in terms of both shape and period, as discussed further below. The main memory 104 may contain information specifying one or more test waveforms to be produced. This portion of the main memory is referred to as the "vector memory" as it specifies the "vectors" that are used to test the DUT. For example, the vector memory may include information that specifies the shape, frequency, pulse timing and other parameters of the test waveform(s) and response waveform(s) that are expected to be received from a DUT in response to the test waveform(s). Operation of the main memory 104 is discussed in further detail below. The digital module 100 may also comprise a main memory control 106 that reads information from the main memory 104 and writes data to the main memory 104. The main memory control also receives signals from the ATE circuitry on lines 110 and 112. The main memory control provides the vector data (i.e., information specifying the characteristics of a waveform to be generated) to a buffer memory 108. A buffer memory control 114 manages the reading of main memory into the buffer. Operation of the buffer memory and buffer memory control is discussed in further detail below.

Still referring to FIG. 1, in one embodiment, the digital module 100 may include a set of one or more high-speed shift registers that receive the waveform information from the buffer memory 108 and produce the test waveform as a serial output that may be applied to test pin(s) to which the DUT is connected. These shift registers 116 and their associated control circuitry are illustrated as block 326. A second set of one or more shift registers may be used to receive the response waveform from the DUT, convert the response to parallel data and supply the response to the main memory control 106, which in turn passes the response to the main memory 104. These shift registers 118, and their associated control circuitry, are illustrated as block 328. Thus, a waveform may be digitally "drawn" using these high-speed shift registers, which may allow for a flexible and relatively inexpensive design, as discussed further below. As illustrated in FIG. 1, many of the components of the digital module 100 may be implemented in an FPGA 102. For clarity, the circuitry for one pin is illustrated in FIG. 1 (other than the main memory 104 which is used for all pins). However, it is to be appreciated that the invention is not limited to any set number of pins, and that additional sets of shift registers and lines may be provided in the digital module to accommodate many pins.

In one example, the shift registers may be serializer/deserializer (SERDES) components. These SERDES may receive a parallel input and convert it to a serial output, or alternatively, may receive a serial input and convert it to a parallel output. On the drive side, SERDES 116 in block 326 may receive, on line 120, parallel data describing a desired waveform and may clock or shift it out in serial form on lines 122a and 122b to draw the test waveform. Similarly, on the input side of the digital module 100, the SERDES 118 may receive, in serial form, a response waveform from the pin on lines 124a and 124b and may convert the response to parallel data for processing. Data is shifted in or out of the SERDES once every SERDES clock cycle. The SERDES clock cycle has a period referred to herein as Ts. In one example, the SERDES may have a data clock speed of about 4 Gigahertz (GHz), allowing a waveform with up to about 250 picosecond (ps) resolution. Although the following discussion of embodiments of the invention may, for simplicity, refer to the shift registers as SERDES, it is to be appreciated that the invention is not limited to the use of SERDES, but rather it should be appreciated that any other type of shift registers may be used.

Operation of the SERDES may be controlled by a system clock having a system clock period Tc. This system clock may be generated using any known method and apparatus, for example, using a phase-locked loop as known to those skilled in the art. In one embodiment, the SERDES may have a 32 bit interface and the SERDES clock period Ts may therefore, be ⅟₃₂ of the system clock period Tc. That is, Tc=32 Ts. For simplicity, the following discussion will assume a 32 bit SERDES interface and will accordingly describe operation of the digital module using bit numbers appropriate for a 32 bit SERDES interface. However, it is to be appreciated that the SERDES may have an interface that is a different number of bits, for example, 16 bits or 64 bits, and that the exemplary numbers of bits and timing information discussed herein may thus be adjusted to accommodate the SERDES interface. In one example, Tc may be 7.5 nanoseconds (ns); corresponding to a system clock speed of 133 Megahertz (MHz) and thus, Ts may be 234 ps. However, it is to be appreciated that many other values for the system clock speed are usable and the invention is not limited to the use of a 133 MHz system clock.

Referring again to FIG. 1, according to one embodiment, the digital module 100 may "drive" each pin either high (H) or low (L) by supplying a binary 1 or 0 to the pin via line 122a. In this case, the drive may be turned "on" by a binary signal supplied on line 122b. In this manner, by driving the pin with the signal on line 122a, the waveform may be serially supplied to the pin, or "drawn," one bit at a time, as discussed further below. The information to control the state of the signal on lines 122a and 122b is supplied from the main memory 104. The digital module 100 may also receive an input from the DUT via "compare" lines 124a (compare H) and 124d (compare L). In this case, the drive may be turned off by a binary signal supplied on line 122b.

Figure 2:
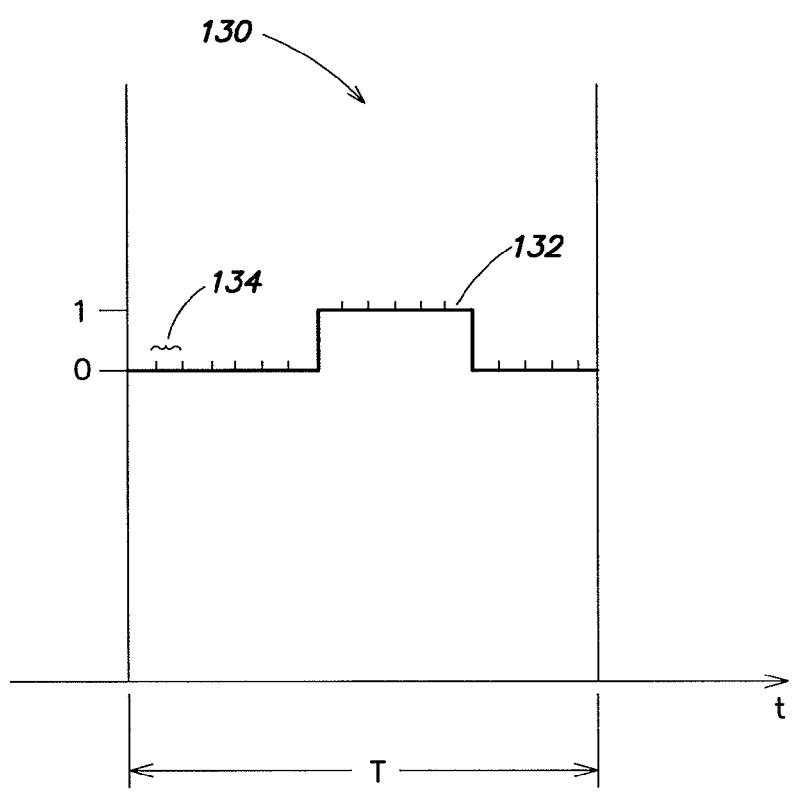
FIG. 2 is a diagram of a vector according to aspects of the invention.

Tests for the DUT may be specified in terms of vectors. A vector is a time period during which a specified waveform is supplied to the DUT via the drive SERDES 116 and/or the response of the DUT is measured against a compare waveform using the compare SERDES 118. Referring to FIG. 2, there is illustrated one example of a vector 130. The vector 130 has a vector period T specified by information supplied from the main memory. In some instances, the vector period T may correspond to one or more system clock periods. In one example, the smallest T may be one Tc, and vector periods of more than one Tc may contain fractional Tc periods (i.e., T need not be an integer multiple of Tc). During the vector period T, a waveform 132 is generated, based on information supplied from the main memory. The waveform may be defined by a number of TICs 134. A TIC is the smallest piece of a given waveform at a given frequency. Thus, TICs define the "granularity" or resolution of a waveform. All the TICs in a given vector are the same size; however, TIC size is not necessarily constant from one vector to another. In one example where the vector period T corresponds to the system clock period Tc, each TIC corresponds to one Ts. However, in the case where T is greater than one Tc, each TIC may correspond to several Ts.

To test a DUT, a vector is read from the main memory. The vector data (also referred to as the vector memory) specifies both the vector period T and the shape of the waveform. To generate each vector with its specified vector period, the digital module may include a period generator. The number of period generators per digital module may depend on design factors such as the layout of the FPGA. One period generator may be used for multiple pins. However, in some instances, the layout of the FPGA may make it difficult to route circuitry from a single period generator to all pins. Therefore, additional period generators may be included as needed.

Figure 3:
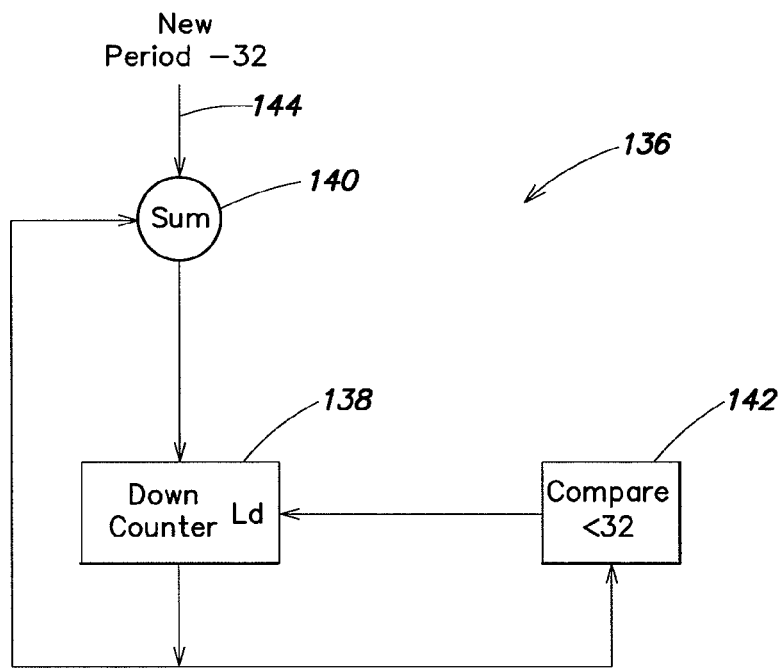
FIG. 3 is a block diagram of one embodiment of a period generator.

Referring to FIG. 3, there is illustrated a block diagram of one example of a period generator according to aspects of the invention. The period generator 136 comprises down counter 138 and an adder 140. In one example, vector periods (T) can range from 32 Ts to $2^{32}$ Ts. As discussed above, the FPGA 102 (see FIG. 1), however, operates using the system clock with period Tc. Thus, the vector period often may not correspond to the system clock period Tc. Therefore, the period generator 136 computes where the next T starts in units of Ts. The clock cycle in which a new vector period T starts may be identified for several purposes. The memory controller may use this information to know when to fetch another set of vector data, and the waveform machinery may use this information to know when to lookup a new waveform and waveform table entry, as discussed below.

In one embodiment, new period values are stored in a waveform table (WFT) in the main memory in increments of Ts–32. It is to be appreciated that if the SERDES in a particular example have an interface that is not 32 bits, the period values may accordingly be stored increments of Ts less another appropriate number. Storing the actual number less 32 may simplify the hardware involved. For example, for the minimum vector period of 32 Ts, the value stored in the WFT is 32–32=0. The down counter 138 counts down the number of Ts. When the current count becomes less than 32, this marks the Tc in which the end of a vector period cycle occurs, and a new period is begun. The count is loaded with the existing count, plus the new period–32. However, since the WFT stores the new period (in increments of Ts)–32, the new count is given by the existing count plus the new WFT entry. The WFT entry is supplied to the adder 140 on line 144. The adder 140 combines the new WFT entry (specifying the new period) with the existing count. A comparator 142 is used to compare the current count value to 32. When the current value is <32, this marks the system clock cycle in which the current period ends and the next one begins. In one example, the comparator 142 may compare the count bits 31:5 to all 0's. In this example, the lowest 5 bits (4:0) always indicate the exact location of the start of a period in Ts's.

Figure 4:
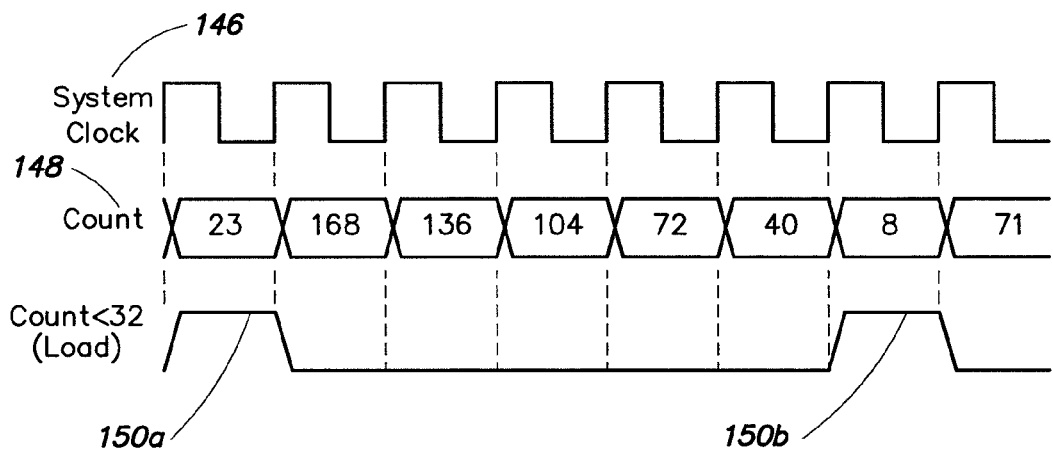
FIG. 4 is a timing diagram illustrating one example of operation of the period generator of FIG. 3.

Referring to FIG. 4, there is illustrated an example of the period generator operation. The count (in Ts) is shown as trace 148, with 32 Ts per system clock (trace 146) period. In this example, a period that begins at Ts number 23 has a period of 177 Ts, and is followed by a period of 95 that begins at Ts 8. As discussed above, the period of 177 Ts is stored in the WFT as 177–32=145. In the example, when the counter counts down to 23, it is loaded (indicated by load pulse 150a) with 23+177–32=168. When the count again falls below 32, the next period (95–32) is loaded, as indicated by load pulse 150b. It is to be appreciated that the location identified by a Ts number is the beginning of the bit period Ts. Thus, if one were to divide a nominal 7.5 ns system clock period into 32 intervals, Ts 0 would refer to the beginning of the 1st interval and would also coincide with the rising edge of the system clock. The 31st interval would be exactly one Ts before the end of the system clock cycle.

According to at least some embodiment, the vectors may be defined using the Standard Test Interface Language (STIL), as defined by IEEE 1450. In these embodiments, the data that specifies a vector in terms of its period and waveform is stored in the main memory in waveform characters (WFCs) and waveform tables (WFTs). Waveform characters are somewhat analogous to timeset definitions used in other languages such as WGL (Waveform Generation Language). STIL supports up to 63 different symbols for WFCs, however, in some examples, a more practical limit might be 32 WFCs per pin. One embodiment of an FPGA for implementation has memory primitives that are 32×18 in size. This may allow easy construction of 32 element waveform tables. A pin's WFC can select a particular waveform from the waveform table.

In one embodiment, each waveform is a bit pattern 63 bits wide. Each bit position within the waveform is known as a TIC, as discussed above. Depending on the period for the vector, at least 32 TICs are used, and up to as many as 63 TICs per waveform. What would be the 64th TIC location is a padding TIC that may be used to pad a waveform when necessary, as discussed further below. TICs can be shifted out of a high speed SERDES transmitter as fast as one TIC per Ts. In some examples, TICs may also be repeated in powers of 2 to stretch the period used for that vector, as discussed further below.

STIL also supports sets of WFCs along with period definitions in a Waveform Table (WFT). There is no specified limit to the number of WFTs that can be used; however, it may not be useful to support more WFTs than WFCs. In one embodiment, by choosing to support 32 WFTs, a mapping can be done that maps a WFC choice in the main memory to an actual address used in the WFT. In one example, this mapping function is a small 1K'5 lookup table. Its address is comprised from a 5 bit (1 of 32) WFT select and a 5 bit (1 of 32) waveform select. Its output is a 5 bit waveform address. In addition to the remap, the WFT select from the main memory also is used to look up a period. As discussed above, periods may be stored as a 32 bit number whose value represents actual number of Ts intervals–32.

Figure 5:
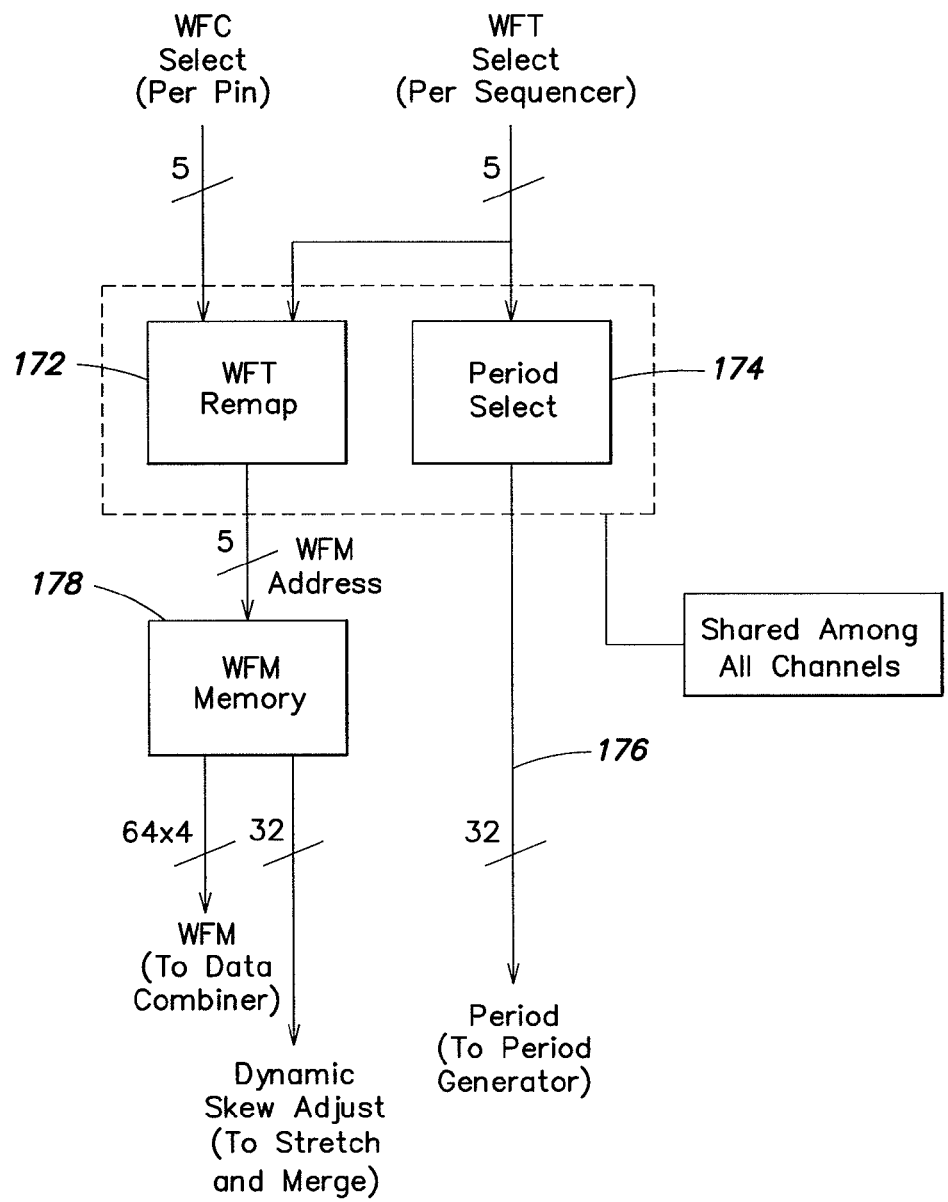
FIG. 5 is a block diagram of one example of waveform table remap, period select and waveform table select circuitry, according to aspects of the invention.

Referring to FIG. 5, there is illustrated a block diagram of one example of the WFT remap, period select and WFT select. A signal indicating WFC select is supplied from the main memory on line 180 to WFT remap logic 172. A signal indicating WFT selection and period selection is also supplied from main memory on line 182 to the WFT remap logic 172 as well as to period select logic 174. The period selection may be shared among all pins, whereas the WFC select may be pin-specific. The period select logic 174 provides a signal on line 176 to the period generator. The WFT select logic 172 provides a waveform address to waveform memory (WFM) 178. The WFM 178, in turn, provides an output signal that specifies the desired waveform. The WFM 178 may also supply a dynamic skew adjust signal on line 180, as discussed further below.

As discussed above, a test waveform may be digitally drawn by supplying the waveform data to an input of a high speed SERDES transmitter, which clocks the waveform out, one bit at a time every Ts. In one embodiment, there may be two SERDES output channels; each fed a full 32 bit word every Tc. One of the output SERDES is used for the Drive HL input (on line 122a in FIG. 1) to the pin electronics, and the other is used for Output Enable (on line 122b in FIG. 1).

Figure 6:
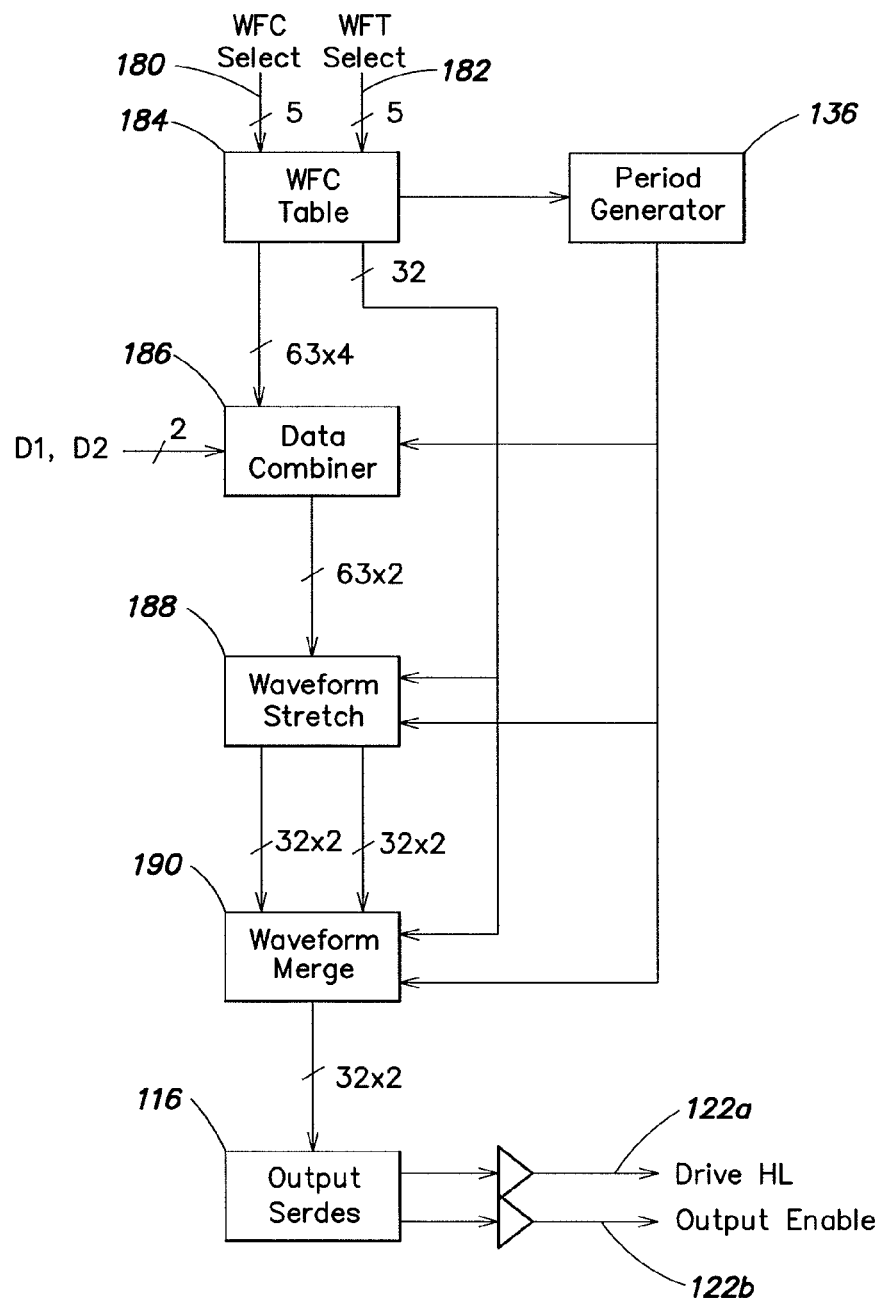
FIG. 6 is a block diagram of one example of SERDES drive circuitry according to aspects of the invention.

Referring to FIG. 6, there is illustrated a block diagram of one example of SERDES Drive circuitry according to aspects of the invention. As discussed above, WFC and WFT selection is done via data from the main memory. WFC select and WFT select signals are supplied on lines 180 and 182, respectively, from the main memory to waveform table logic 184 (which includes the WFT remap logic 172 and period select logic 174 from FIG. 10). The output waveforms are constructed by looking up a waveform bit pattern, combining it with other pattern data (referred to as D1, D2, as discussed above), optionally stretching it by a power of 2 to fit with a given period, merging successive waveforms and loading the resulting bit patterns into an output SERDES. There is one complete SERDES drive circuit per output pin channel, with the exception of the period generator which may be shared amongst a plurality of pin channels.

Still referring to FIG. 6, a data combiner 186 may be used to combine the output signal from the waveform memory (the waveform data) with the pattern data. The pattern data comprises additional data bits received from a portion of the main memory referred to as the pattern memory. Using these additional data bits from the pattern memory provides additional flexibility without requiring as large a WFM memory as if they were not used. The combination may create a 63 bit data stream that is fed to the Drive HL and Output Enable SERDES transmitters, via the waveform stretch circuitry 188 and waveform merge circuitry 190. Operation of the waveform stretch circuitry 188 and waveform merge circuitry 190 is discussed below.

STIL syntax contains descriptions of five states, namely: U, D, Z, P and N. U represents a drive high, D represents a drive low, and Z represents driver in high impedance state. P (previous) represents a drive to the most recent U or D state (i.e., drive to the last state of the previous cycle), and N is a drive to a "don't care" state (in other words, changing N from U to D or vice-versa should not change the result of the test program).

In one example, each TIC within a particular waveform entry in WFM may be represented by 4 bits. These 4 bits allow various desired waveforms to be constructed easily. However, it is to be appreciated that the invention is not limited to the use of 4 bits to represent each TIC and other numbers of bits may be used in other examples. Table 1 below illustrates one example of how the 4 bits from the WFM are combined with the pattern data bits (D1 and D2) from pattern memory to create Drive H/L and Output Enable signals which are supplied to the output SERDES 116.

TABLE 1

| TIC Code | Mnemonic | Drive H/L | Output Enable |
|---|---|---|---|
| 0 | D | 0 | 1 |
| 1 | U | 1 | 1 |
| 2 | D1 | D1 | 1 |
| 3 | D1* | D1* | 1 |
| 4 | D2 | D2 | 1 |
| 5 | D2* | D2* | 1 |
| 6 | P | Previous | 1 |
| 7 | P | Previous | Previous |
| 8 | $Z_D$ | 0 | 0 |
| 9 | $Z_U$ | 1 | 0 |
| 10 | $Z_{D1}$ | D1 | 0 |
| 11 | $Z_{D1}*$ | D1* | 0 |
| 12 | $Z_{D2}$ | D2 | 0 |
| 13 | $Z_{D2}*$ | D2* | 0 |
| 14 | $Z_P$ | Previous | 0 |
| 15 | ? | D1 | D2 |

In one embodiment, the STIL states U, D and P may be listed directly. For convenience, the equivalent of U and D may be generated with D1, D1*, D2, and D2*. By using pattern data bits D1 and D2 in this way, merged STIL waveforms may be more easily created. Since the N state may be anything, in one example, it may be made the same as the STIL P state. This is helpful in the creation of the P state.

The STIL P state means drive to the last U or D value, and in one example, this also means D1, D1*, D2, and D2* as well. Accordingly, there is a need to remember what the last value of DriveHL was when Output Enable was last asserted. To do this, in one example, the Z state may be split into seven Z states, each with a different way to drive the DriveHL input to the pin electronics, but all with the output enable disabled. When constructing a WFM entry, the more specific form of Z TIC code may be used. This allows the system to maintain the exact same value at DriveHL. Furthermore, in one example, a WFM entry may be padded if it is not a full 64 TICs wide, by replicating the last valid TIC in that waveform. Now, by remembering the 64th TIC in a previous waveform, the DriveHL value may be maintained across vector boundaries. It should be noted that as the system transitions from vector to vector, the actual value of the last TIC in the current vector is remembered, not whether it came from D1 or D2. Therefore, Zp in a subsequent vector is correct, and any use of P in a later vector is also correct.

Figure 7:
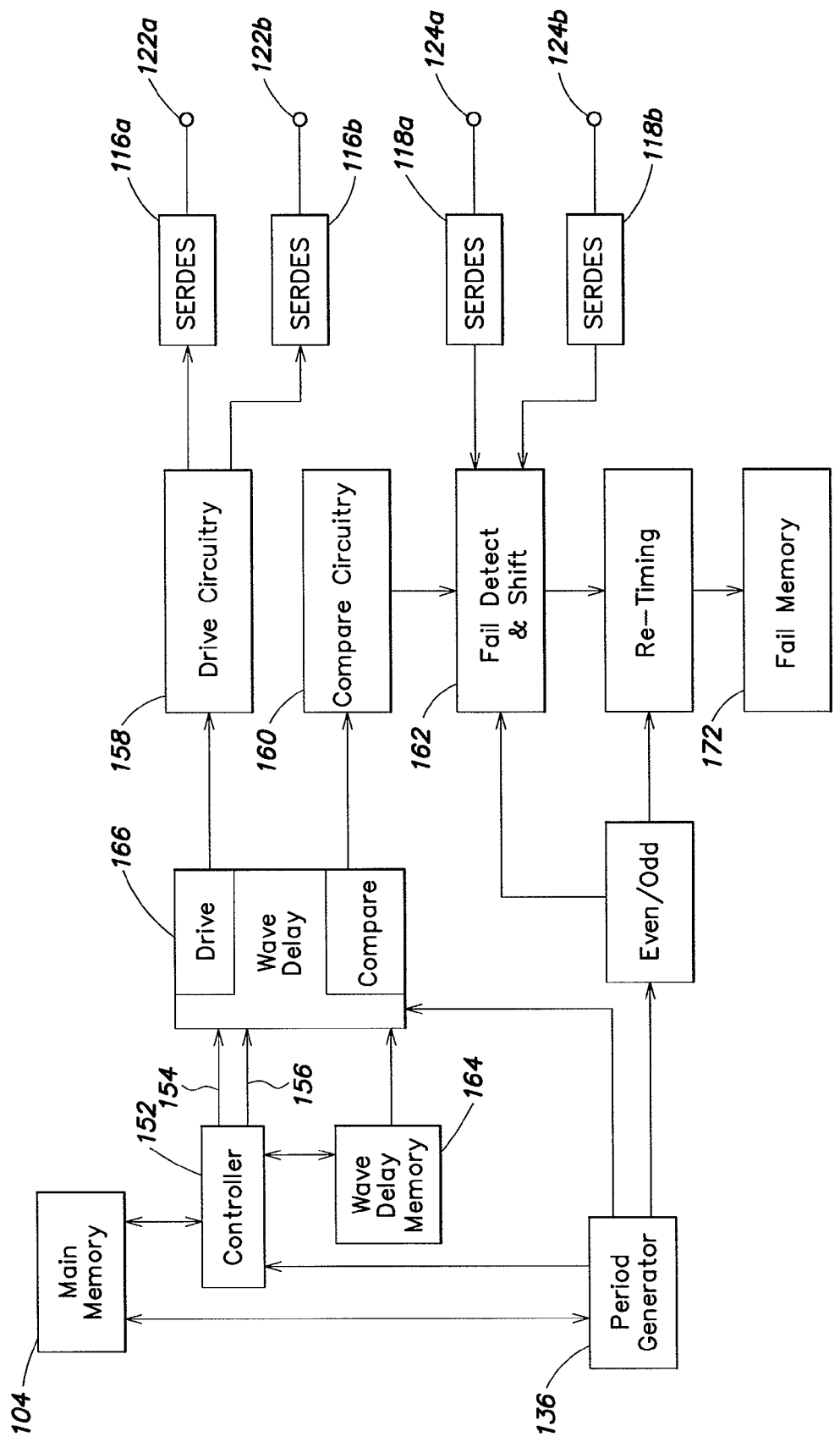
FIG. 7 is a block diagram of another example of a digital module according to aspects of the invention.

In another embodiment, rather than defining the drive waveform using STIL (including WFCs and WFTs), vector data from the main memory may be compressed into a set of bits referred to as the "WaveSet" (WS). Referring to FIG. 7, there is illustrated a block diagram of one example of a portion of a digital module according to aspects of the invention. A controller 152 may receive vector data from the main memory 104 and convert and compress the data into two sets of bits, namely the WaveSet provided on line 154 and pattern data (D1 and D2 discussed above) provided on line 156. Together, the WaveSet and pattern data describe the waveform that is to be shifted out through the SERDES to the test pin. In one example, the WaveSet may include 4 bits and the pattern data may include 2 bits. However, it is to be appreciated that these numbers are one example and that the invention is not limited to a particular number of bits for either the WaveSet or the pattern data. Together, the WaveSet and the pattern data may describe a waveform, or part thereof, that is to be supplied to a pin of an ATE test head (or compared with a response waveform received from a DUT via a pin of the ATE, as discussed further below).

Still referring to FIG. 7, the WaveSet may be supplied to SERDES driver waveform circuitry 158. The term "driver waveform" as used herein refers to a waveform that is supplied by the digital module to a pin to stimulate a DUT that is coupled to the pin. The driver waveform may be defined by subdividing the desired waveform into a plurality of TICS (i.e., a set of equal size waveform states), as discussed above. Given an initial state of the signal at a first TIC, the driver waveform may be specified in terms of how the signal changes from TIC to TIC. In one embodiment, the driver waveform may have eight different states, namely, "previous" (meaning the last state of the previous cycle), Z (meaning high impedance), 0 (binary 0), 1 (binary 1), D1 (either a 1 or 0 from the first bit of the pattern data) D1* (meaning the inverse of D1), D2 (either a 1 or 0 from the second bit of the pattern data) and D2* (i.e., the inverse of D2). In one example, the driver waveform may be converted into a bit pattern referred to as "DRV_TIC." In one example, DRV_TIC may be 64 TICs in length, with each TIC being 3 bits. This bit pattern may be stored in the driver waveform memory 116. In the event that the driver waveform does not reach 64 TICS in length, the signal state for the remaining TICS of the 64 may be specified in the last TIC of the driver waveform. This may allow great flexibility in specifying driver waveforms of differing lengths. Of course, it is to be appreciated that the invention is not limited to the use of 64 TICs for DRV_TIC and any other number may be used. In addition, the number of bits used to specify each TIC may be variable and/or design-specific and is not limited to 3 bits. For example, in the embodiments discussed above, each TIC may be 4 bits in length.

Table 2 below illustrates one example of DRV_TIC formatted into two data sets, DIO and DRV. Referring to FIG. 7, DRV may be supplied to the drive SERDES 116a to produce the drive signal on line 122a, and DIO may be supplied to the I/O SERDES 116b to turn the drive signal on and off. The example given in Table 2 is one way to encode each SERDES. However, it is to be appreciated that this example is for the purpose of illustration and not intended to be limiting. "Pattern" refers to the pattern data comprising D1 and D2.

TABLE 2

| Driver Waveform | Pattern | |
| --- | --- | --- |
| TIC/State | DIO | DRV |
| Previous | 000 | Previous | Previous |
| Z | 001 | 0 | 0 |
| 0 | 010 | 1 | 0 |
| 1 | 011 | 1 | 1 |
| D1 | 100 | 1 | D1 |
| D1* | 101 | 1 | D1* |
| D2 | 110 | 1 | D2 |
| D2* | 111 | 1 | D2* |

Figure 8:
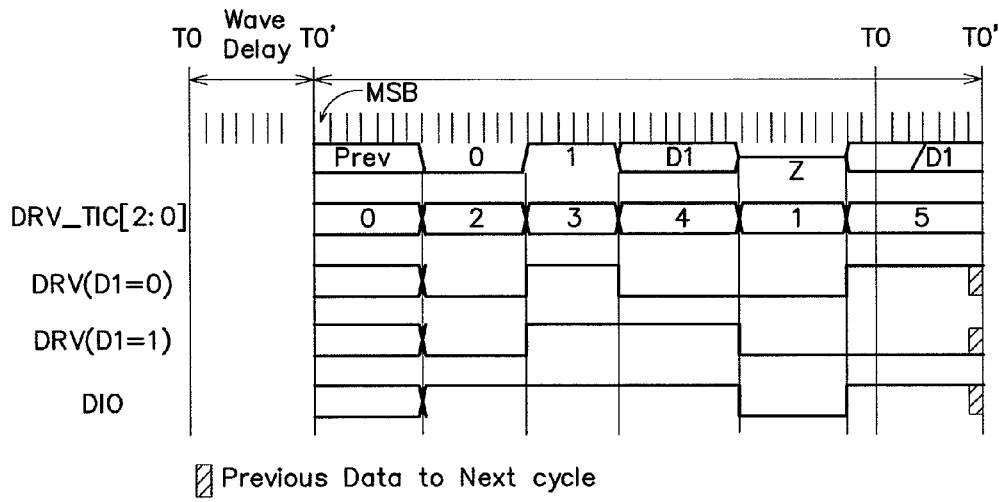
FIG. 8 is a timing diagram of one example of a driver waveform according to aspects of the invention.

Referring to FIG. 8, there is illustrated one example of a driver waveform according to aspects of the invention.

As discussed above, in one example, the high speed SERDES may have a bit period of about 250 ps. However, in some circumstances, the DUT may operate significantly more slowly. Therefore, it may be desirable to "slow down" the drive waveform. Thus, as discussed above with reference to FIG. 6, prior to being fed to the output SERDES, the waveform may be "stretched" to accommodate vector periods T that are longer than one system clock period Tc. This stretching may be accomplished by replicating the bit values of each Ts, such that a TIC becomes several Ts in length. To "slow down" the waveform, the TICs may be "stretched" by repeating each Ts several or many times such that, for example, a pulse that may have been 1 Ts long (corresponding to 250 ps for a 4 GHz SERDES) may become 128 Ts long (corresponding to 32 ns) by repeating the Ts 128 times to create a "stretched" TIC before sending the next TIC. This concept may be referred to as waveform stretching.

Figure 9:
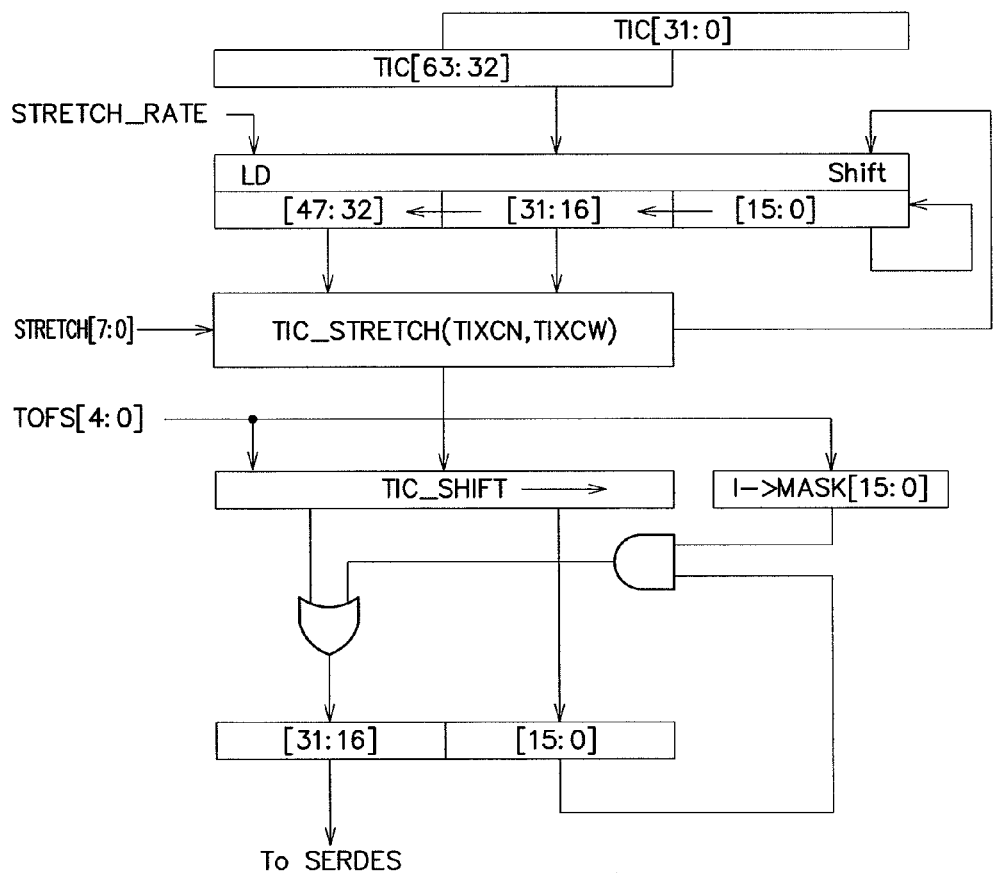
FIG. 9 is a block diagram of one example of circuitry to achieve TIC stretching that may be used in the digital module of FIG. 7.

In the embodiment illustrated in FIG. 7, waveform stretching may be accomplished in the drive circuitry 158. Similarly, on the compare side, waveform stretching may be accomplished in the compare circuitry 160, as discussed further below. Referring to FIG. 9, there is illustrated one example of stretching circuitry that may be incorporated into the drive circuitry 158 (and/or compare circuitry 160). In one example, all formatting of the waveform data may be accomplished before the stretching is done, such that the stretching can be achieved by simple replication of each TIC a given number of times. In this manner, any vector period may be achieved, provided only that the minimum vector period cannot be shorter than one system clock period Tc. This ability to accommodate many different vector periods may provide a significant advantage over ASIC designs which produce waveforms with a fixed period, generally between 1 and 100 ns, and which are not adjustable. In contrast to fixed ASICs, a digital module according to aspects of the invention may be scalable with improving technology (e.g., TICs can be shorter as devices become faster, allowable higher speed testing) and may be flexible to accommodate many different waveform periods as needed to test different devices under test by stretching the TICs as necessary. Thus, a digital module according to embodiments of the invention may accommodate both very high speed waveforms (with short periods) and low speed waveforms (e.g., periods of milliseconds) by adjustably stretching the TICs as needed.

In some examples, particularly where each test will use only a single vector period for all test vectors, the system clock speed may be altered to accommodate the vector period, such that the waveform always has the maximum resolution, i.e., each TIC corresponds to one Ts. However, in many instances, as the vector periods are slowed down from the maximum rate, it may become impractical to generate waveforms with the same resolution as at higher clock rates. In some embodiments, this is due to the limitation in width of the WFC table, which in one example, may be fixed at 64 TICs wide. For system clock periods Tc of 7.5 ns to 15 ns no stretching of the waveform may be required, as the waveform can be built using one Ts per TIC. However, vector periods of 15 ns and longer may require some stretch applied to the TICs. It is to be appreciated that the exemplary limit values given herein (e.g., 15 ns) depend on the number of bits in the SERDES interface and/or the size of the WFC tables and WFTs. Therefore, if these sizes (in number of bits) changes, the timing limits will also change accordingly. Therefore, it is to be appreciated that the numbers given herein are for example only and not intended to be limiting.

According to one embodiment, stretching may be done in powers of 2 starting at periods of 15 ns. Waveform stretching may be done by using multiple Ts per TIC. After stretching, there is still a maximum number of 63 points in a waveform where things can change (i.e., 63 TICs), but the waveform may span vast amounts of time. For example, to stretch a waveform to fit a period between 15 ns and 30 ns, each TIC from the WFC memory is duplicated (×2) and spans 2 Ts. In another example, to stretch a waveform to fit a period between 30 ns and 60 ns, each TIC is repeated four times (×4) and spans 4 Ts. Stretching is possible throughout the entire period range of the timing generator. Since vector periods are in integer increments of Ts, the last TIC of a stretched waveform may not be a full power of 2 number of Ts. This last TIC may be a single Ts up through the stretch factor of Ts.

As discussed above, in at least some embodiments, the output SERDES uses a 32 bit interface. Therefore, stretch computations may all be done in 32 bit chunks even though the WFC memory may be 64 bits wide. An output register is loaded with 32 bits and fed to the Waveform Merge logic (discussed below), with a new 32 bits every Tc (e.g., every 7.5 ns). In one example, advantage may be taken of the fact that a given WFC entry is specific to a particular WFT, and therefore a particular period, and the WFC entry may be loaded in such a way to make stretching easier by the hardware. A combination of multiplexers and shift registers easily accomplishes this function. For example, consider the output register bit 0. No matter whether the waveform is stretched or not, the output register bit 0 is always fed from WFC[0]. Output register bit 1 can be fed from WFC[1] if there is no stretching, or from WFC[0] for a stretch factor of 2 or more. Output register bit 2 can be fed from WFC[2] for no stretch, from WFC[4] for stretch by 2, or by WFC[0] if stretching by 4. The remaining bits sources are listed in 3 below. It should be noted that the sources that feed the output register span the entire 64 bit width of the WFC memory. This is so that the stretch can be accomplished completely by using shifts and the multiplexer.

TICs is 177/4, which equals 44.25 and is thus, rounded up to 45 TICs. As a result, the last TIC is only a single Ts in duration (whereas all the other TICs are 4 Ts in duration).

Figure 10:
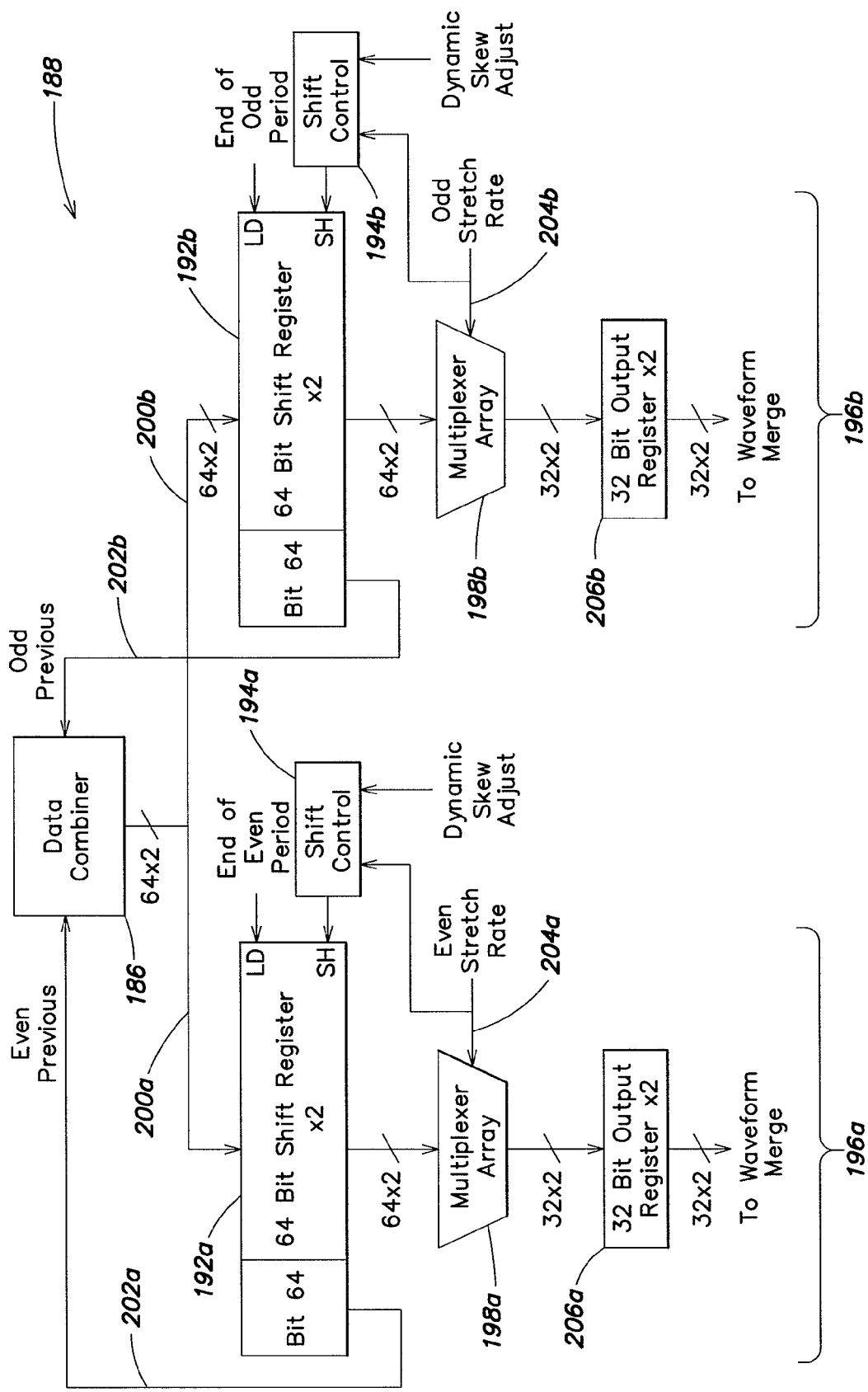
FIG. 10 is a block diagram of one example of waveform stretch circuitry according to aspects of the invention.

Referring to FIG. 10, there is illustrated a block diagram of one example of Waveform Stretch logic 188 according to aspects of the invention. In the illustrated embodiment, there are two identical stretch units, referred to as the even stretch unit 196*a* and the odd stretch unit 196*b*, each one used to stretch alternating waveforms. For simplicity, the following discussion will follow the part through the even stretch unit, which is used to stretch an even vector period. It is to be appreciated that the odd stretch unit may function in exactly the same way as does the even stretch unit, and that items identified by reference numerals with the designation "b" in the odd stretch unit are identical to items identified by the same reference numeral with the designation "a" in the even stretch unit.

As each previous vector period expires, a new waveform is loaded into the alternate unit's shift register from the output of the data combiner 186. For example, when the previous odd vector period expires, a new waveform is loaded into the even shift register 192*a*, from the data combiner 186, as indicated by line 200*a*. In one example, this shift register 192*a* always shifts one bit to the right (toward the least significant bit) unless it is being loaded with a new WFM. The $64^{th}$ bit of the

TABLE 3

| Output Register Bit | Source X1 | Source X2 | Source X4 | Source X8 | Source X16 | Source X32 | Mux required |
|---|---|---|---|---|---|---|---|
| 0 | 0 | 0 | 0 | 0 | 0 | 0 | None |
| 1 | 2 | 0 | 0 | 0 | 0 | 0 | 2:1 |
| 2 | 4 | 4 | 0 | 0 | 0 | 0 | 2:1 |
| 3 | 6 | 4 | 0 | 0 | 0 | 0 | 3:1 |
| 4 | 8 | 8 | 8 | 0 | 0 | 0 | 2:1 |
| 5 | 10 | 8 | 8 | 0 | 0 | 0 | 3:1 |
| 6 | 12 | 12 | 8 | 0 | 0 | 0 | 3:1 |
| 7 | 14 | 12 | 8 | 0 | 0 | 0 | 4:1 |
| 8 | 16 | 16 | 16 | 16 | 0 | 0 | 2:1 |
| 9 | 18 | 16 | 16 | 16 | 0 | 0 | 3:1 |
| 10 | 20 | 20 | 16 | 16 | 0 | 0 | 3:1 |
| 11 | 22 | 20 | 16 | 16 | 0 | 0 | 4:1 |
| 12 | 24 | 24 | 24 | 16 | 0 | 0 | 3:1 |
| 13 | 26 | 24 | 24 | 16 | 0 | 0 | 4:1 |
| 14 | 28 | 28 | 24 | 16 | 0 | 0 | 4:1 |
| 15 | 30 | 28 | 24 | 16 | 0 | 0 | 5:1 |
| 16 | 32 | 32 | 32 | 32 | 32 | 0 | 2:1 |
| 17 | 34 | 32 | 32 | 32 | 32 | 0 | 3:1 |
| 18 | 36 | 36 | 32 | 32 | 32 | 0 | 3:1 |
| 19 | 38 | 36 | 32 | 32 | 32 | 0 | 4:1 |
| 20 | 40 | 40 | 40 | 32 | 32 | 0 | 3:1 |
| 21 | 42 | 40 | 40 | 32 | 32 | 0 | 4:1 |
| 22 | 44 | 44 | 40 | 32 | 32 | 0 | 4:1 |
| 23 | 46 | 44 | 40 | 32 | 32 | 0 | 5:1 |
| 24 | 48 | 48 | 48 | 48 | 32 | 0 | 3:1 |
| 25 | 50 | 48 | 48 | 48 | 32 | 0 | 4:1 |
| 26 | 52 | 52 | 48 | 48 | 32 | 0 | 4:1 |
| 27 | 54 | 52 | 48 | 48 | 32 | 0 | 5:1 |
| 28 | 56 | 56 | 56 | 48 | 32 | 0 | 4:1 |
| 29 | 58 | 56 | 56 | 48 | 32 | 0 | 5:1 |
| 30 | 60 | 60 | 56 | 48 | 32 | 0 | 5:1 |
| 31 | 62 | 60 | 56 | 48 | 32 | 0 | 6:1 |

To determine the stretch factor, take the vector period (this is the "real" vector period, not the WFT entry), divide it by 32, and look for the highest power of two that is less than or equal to the result. For example, for a period T=177 Ts, perform the calculation: 177/32=5.53. The highest power of two less than 5.53 is 4. Therefore, to achieve this vector period, the stretch factor is 4×. In this example, the length of the waveform in shift registers is never shifted; its value remains until reloaded when a new waveform starts. The value of this bit is provided to the data combiner 186, as indicated by line 202*a*. The $64^{th}$ bit is remembered from one vector to be used in the next vector to create the "previous" state.

Still referring to FIG. 10, the bit stream from the shift register 192*a* is fed to a multiplexer array 198*a*. The multiplexer array 198a also receives a signal on line 204a indicating the stretch rate to be implemented for the current vector period. The stretch rate is determined as discussed above. Based on the stretch rate information, the multiplexer array 198a multiplexes the received bit stream, as described above in Table 3. The Shift Control block 194a also receives the stretch rate information and shifts the 64 bit shift register 192a as required to get the resulting stretched waveform. For stretch values of 2, 4, 8, 16 or 32, the shift register 192a is shifted every Tc. For stretch values of greater than 32, the shift register 192a is shifted every (stretch rate/32) Tcs. The Shift Control 194a may also modify the stretch used for the very first TIC of a waveform that is stretched by more than 32 by reducing the number of Tcs before the first shift. This first TIC modification is part of the dynamic skew adjust, which is discussed further below. The output from the multiplexer array 198a is fed to a 32 bit output register 206a from which it is provided to the waveform merge circuitry 190 (see FIG. 6) and finally to the output SERDES 116.

As discussed above, vector periods may be an arbitrary number of Ts and may not correspond with an integer number of system clock cycles. Accordingly, to seamlessly transition from one vector period to another, vectors are alternated through "even" and "odd" paths (arbitrarily designated and not intended to imply an even or odd number of Ts in any vector period) and successive waveforms are "merged," as discussed below, to account for instances where the vector transition occurs mid-system clock cycle.

According to one embodiment, the waveform merge circuitry takes a remaining N (N=0, . . . , 31) Ts bits from the current (optionally stretched) waveform and merges with it 32−N Ts bits from the next (optionally stretched) waveform to fill a system clock cycle with 32 Ts bits. The waveform merge circuitry then doles out Ts bits from the next waveform in 32 bit chunks, one chunk per Tc until there are less than 32 Ts bits left in the current vector period. It then merges with the next (optionally stretched) waveform. This process continues for the duration of testing.

Figure 11:
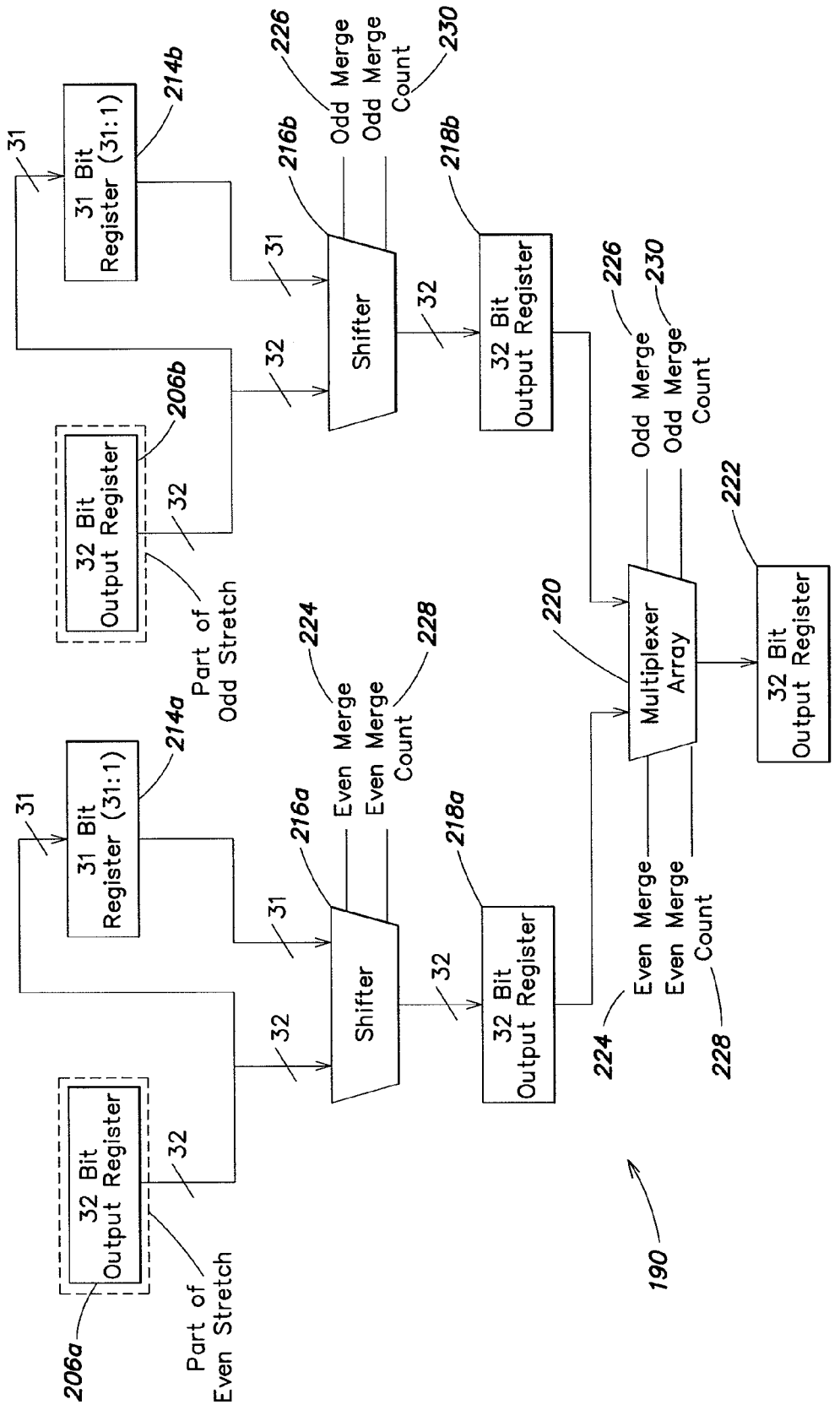
FIG. 11 is a block diagram of one example of waveform merge circuitry according to aspects of the invention.
Figure 12:
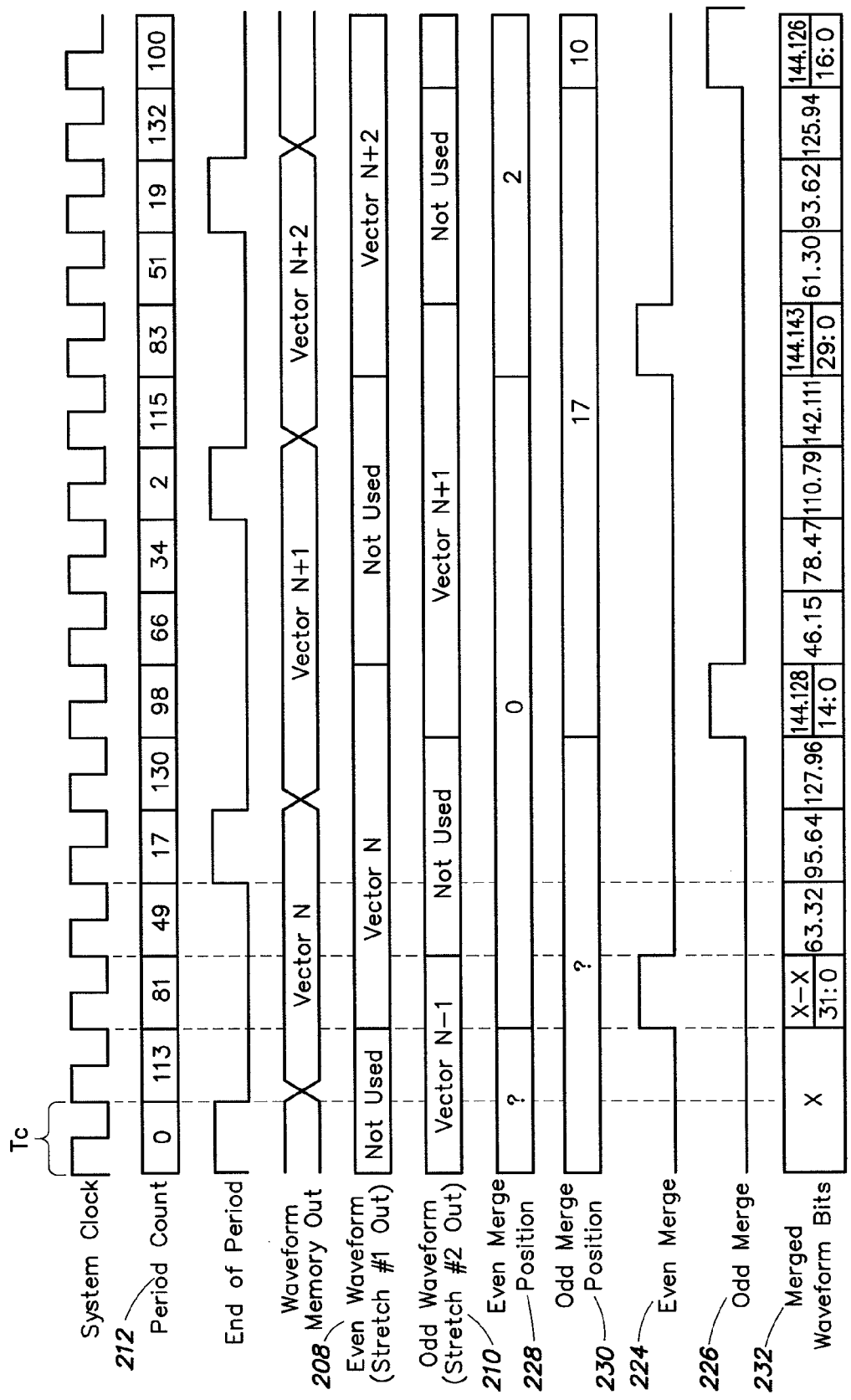
FIG. 12 is a timing diagram illustrating an example of the operation of the waveform merge circuitry of FIG. 11.

Referring to FIG. 11, there is illustrated a block diagram of one example of the waveform merge circuitry 190. As with FIG. 10, items identified by reference numerals having the designation "a" are located in the "even path" and are identical to items identified by the same reference numeral having the designation "b" (which are in the "odd path"). An illustration of the merging process is shown in FIG. 12. In this example, a period of 145 Ts repeats. In FIG. 12, the output from the even path 196a (see FIG. 10) is indicated by trace 208 and the output from the odd path 196b is indicated by trace 210. Where an overlap occurs, a merge is done. Overlaps occur when the period count (trace 212) is less than 32. If the period count 212 is 0, the entire clock cycle is filled with the new stretched waveform and there is no contribution from the previous waveform.

In the example illustrated in FIG. 12, the period count is initially counted down to exactly 0 indicating that the starting bit position of the next waveform will be bit 0, and this happens to be an even waveform. The Even Merge signal 224 and Even Merge Position 228 instruct the even side shifter 216a to select the 32 bits of the Even Stretch output register 206a with no offset. Were it needed, the offset would be provided by register 214a. The most recent Odd Merge Position 230 (in this example, this value is unknown, however, it is irrelevant because the Even Merge Position=0) is selecting some shift value (from register 214b) for the odd side. The shifters 216a and 216b provide a shifted bit pattern to the holding registers 218a and 218b, respectively. The two merge positions (even and odd) and the two merge signals (even and odd) instruct the Multiplexer Array 220 to select bits 31:0 from the even side, and no bits from the odd side during the merge cycle.

After the merge and until the next merge, the even side continues to provide words with the same (0) shift offset. The next merge is an odd merge, and the odd merge position in this example is 17. During the merge, the even merge position 224 (still 0) selects the same set of 32 bits from the even waveform, the new odd merge position 230 will select bits 14:0 from the odd side 32 bit register 206b, and bits 31:15 from its 31 bit register 214b to form a 32 bit odd word. The even and odd words are combined using the odd merge position 230, resulting in bits 16:0 taken from the even side (last portion of even waveform) and bits 31:17 taken from the odd side (first portion of odd waveform, bits 14:0). After this merge, subsequent words are pulled from the odd side with the upper 15 bits from the lowest bits of the 32 bit register 206b, and the lower 17 bits from the uppermost bits of the 31 bit register 214b. The merged waveform is shown as trace 232 in FIG. 12 and is provided to an output register 222 to be sent to the output SERDES 116 (see FIG. 6). The merge operation continues for the duration of the test.

As vector periods get longer and longer, TICs may also become longer and longer due to the stretching that may occur, as discussed above. There can be instances where timing between some events on different pin channels may need (or prefer) better precision than what is possible with the stretched TIC resolution. Accordingly, at least some embodiments may implement a procedure referred to as dynamic skew adjustment. Dynamic skew adjustment allows an entire (stretched) waveform to be skewed in $T_S$ increments ahead in time up to 1 TIC less 1 $T_S$. So, if there is an important edge within a waveform relative to another channel, dynamic skew adjustment allows that edge to be positioned with $T_S$ resolution, with all remaining events within the waveform retain TIC resolution.

In one embodiment, the memory primitives used (32×18) may result in total memory size of 72×4. However, only 64×4 are used for the WFM. The remaining 8×4=32 portion may be used to store a dynamic skew value that can be used to make Ts resolution positional adjustments to the waveform transitions. This may be particularly important when TICs are many Ts wide. According to one embodiment, by using unused bits in the memory element used for the WFT, a dynamic skew adjust value can be associated with each WFC. The lower 5 bits of this value may provide the number of $T_S$ to shift the waveform prior to merging. The upper bits may be used to eliminate multiples of 32 Ts (complete Tc's) from the stretch of the first TIC. Dynamic skew adjustment may be thought of as a negative time shift—the operation moves events in a waveform to a lower time value (ahead in time).

For example, suppose a device that is being clocked at 2 MHz and the system needs to test an input with a setup time of 5 ns. The system clock period in this example is 500 ns, which can be generated with 2133 Ts, each Ts being approximately 234 ps. With a period this size, a TIC size of 64 Ts may be used, which corresponds to about 15 ns per TIC. Without any way to adjust between channels, and assuming that the channels are perfectly lined up with each other, a setup time of 0 ns or 15 ns could be tested. However, neither of these is very close to the desired test value of 5 ns. By using the dynamic skew adjustment, the two channels would first be programmed to provide 0 ns of setup. Then, a dynamic skew adjust value of −5 ns would be used, which in this example, corresponds to about 21 Ts. When the vector plays, this waveform is output 21 $T_S$ earlier than it would have been without the skew adjust, thereby allowing for the test of a 5 ns setup time. It is to be appreciated that in at least one embodiment, the dynamic skew adjustment circuitry may only provide one adjustment per vector period. Normally, there is but one event within the period whose time must be adjusted as precisely as possible, the remaining events will need to be on adjusted TIC boundaries. Thus, in the example above, the system could not simultaneously test a 5 ns setup and a 5 ns hold, for if the first edge is adjusted to be 5 ns before the system clock, then subsequent edges need to be in TIC increments later (15 ns). The system could test a 10 ns hold, or 25 ns hold, but not a 5 ns hold. However, setup and hold could be tested in different vectors. In this case, each vector could have a different skew adjustment, and that would allow testing of both a 5 ns setup and 5 ns hold.

As discussed above and, for example, referring again to FIG. 7, the digital module may also receive a response waveform from the DUT (via the pin connected to lines 124a and 124b). To determine whether the response waveform meets an expected waveform, the response waveform may be compared with a compare waveform. In one example, two input SERDES 118a, 118b may be used per channel, as shown, which are fed from the two comparator outputs of the pin electronics 124a, 124b. These SERDES 118a, 118b receive a serial response waveform, bit by bit, and convert it to parallel data from faster processing.

In the embodiment illustrated in FIG. 7, the compare waveform may be defined in terms of TICs in a manner similar to that in which the drive waveform is defined, and may be processed in compare circuitry 160. In one example, the compare waveform may be converted into a bit pattern comprising 64 TICs with each TIC being four bits. The bit pattern is referred to as $CMP_{13}$ TIC. Again, when the compare waveform does not reach 64 TICs, the remaining TICs may be designated X, meaning it is irrelevant what bit values appear during those TICs because the data of interest has ended. The response waveform from the SERDES 118a may be compared with the CMP_TIC bit pattern and using fail detect circuitry 162, which is described in further detail below. In one example, the compare waveform may be defined in terms of a strobe position with each TIC. In one example, there may be nine different states for the compare waveform. However, it is to be appreciated that the invention is not so limited and more or fewer compare waveform states may be used. Particularly, should one wish to use 3 bits per TIC (as for the example driver waveform discussed above), one may choose to use only 8 different compare waveform states.

For example, some compare waveform states may include X (i.e., bit value is irrelevant), V (specifying that the compare is valid, either high or low), L (received signal during the TIC must be low), H, (received signal during the TIC must be high), Z (high impedance), D1 (to compare low or high received signal from the pin with the value of D1 from the pattern data), D1* (inverse of D1), D2 (to compare low or high received signal from the pin with the value of D2 from the pattern data) and D2*. Table 4 below shows one example of CMP_TIC formatted to three data sets, namely STB (meaning strobe on (1) or off (0)), CPH for compare high and CPL for compare low. Pattern again refers to the pattern data including D1 and D2.

TABLE 4

| Compare Waveform | Pattern | | |
|---|---|---|---|
| TICS | STB | CPH | CPL |
| V | 1000 | 1 | CPL* | CPH* |
| L | 1001 | 1 | 0 | 1 |

TABLE 4-continued

| Compare Waveform | Pattern | | |
|---|---|---|---|
| TICS | STB | CPH | CPL |
| H | 1010 | 1 | 1 | 0 |
| Z | 1011 | 1 | 1 | 1 |
| D2 | 1100 | 1 | D2 | D2* |
| D2* | 1101 | 1 | D2* | D2 |
| D1 | 1110 | 1 | D1 | D1* |
| D1* | 1111 | 1 | D1* | D1 |
| X | 0xxx | 0 | 0 | 0 |

Figure 13:
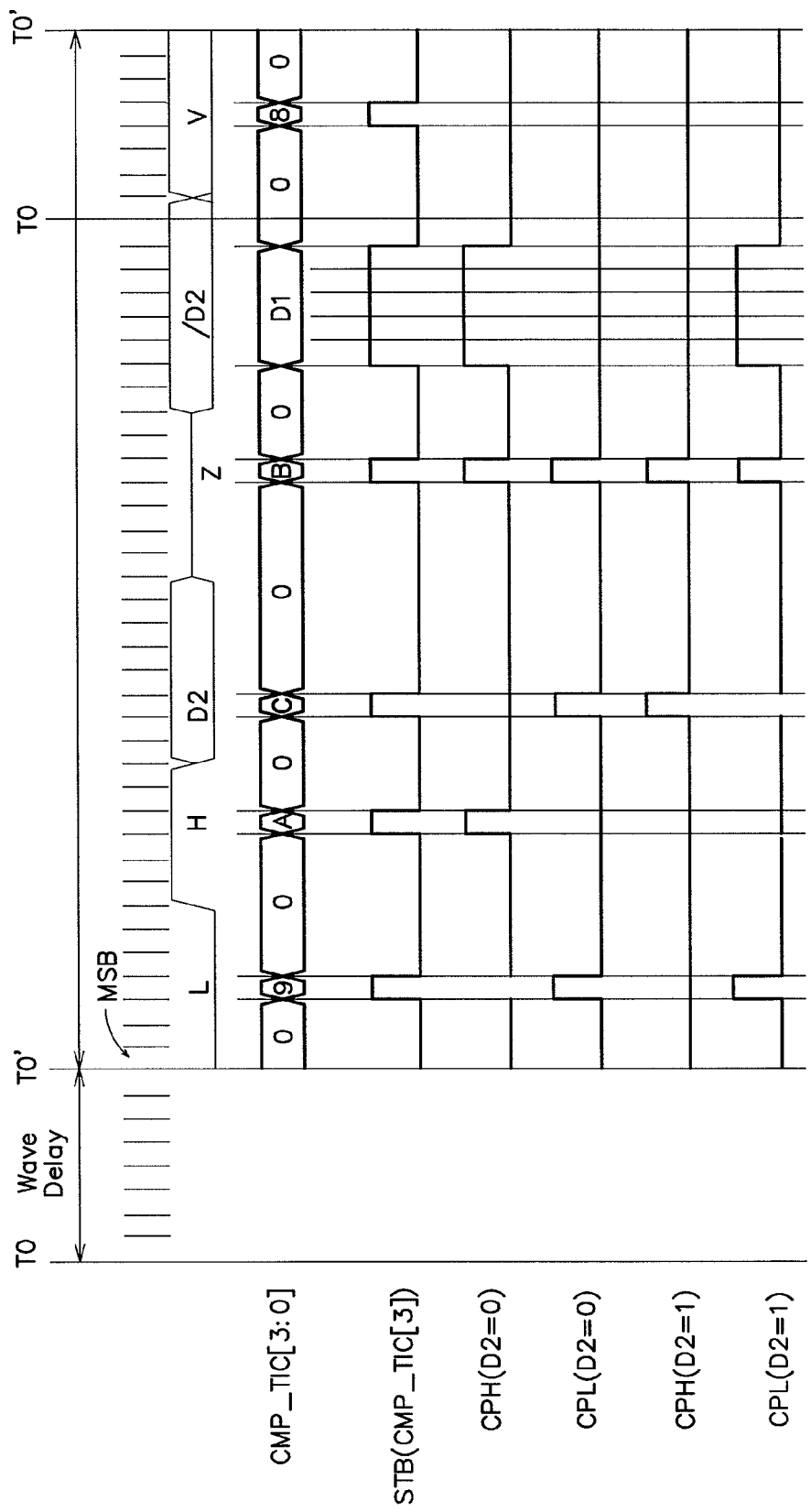
FIG. 13 is a timing diagram of one example of a compare waveform according to aspects of the invention.

FIG. 13 illustrates one example of a compare waveform according to aspects of the invention.

Referring to FIG. 14, there is illustrated one example of a fail detect circuit that may be included in the fail detect block 162, and a Table showing one example of formatting for compare and fail data. As discussed above, the compare SERDES 118a receive the response waveform in serial format and convert it to parallel data. This parallel data is fed to the fail detect circuitry 162. The fail detector 162 may perform parallel processing of the TICs in the response waveform using the compare waveform to determine whether the DUT is operating correctly (response waveform matches expected data received from the vector memory) or whether the device fails. This comparison may be performed TIC by TIC, rather than by using a strobe signal, as is done in conventional ATE. If the DUT fails, the digital module may provide a fail signal to indicate to an operator that the DUT is bad. In one embodiment, a fail memory 172 may be used to store the condition that caused the failure. For example, the fail memory may store information regarding which expected state of CMP-_TIC was not met by the DUT. This may be useful to allow an operator to know not only that the DUT failed, but also why it failed. Other examples of fail detector circuitry and operation are discussed below.

Referring again to FIG. 1, in at least one embodiment, the compare SERDES 118a receives a response signal on lines 124a (compare H) and 124b (compare L). SERDES compare circuitry (not shown) is used to analyze this data and the results are collected in a fail buffer 126 and optional capture buffer 128. The fail buffer 126 is a buffer that temporarily stores fail records before final storage in the main memory 104. The fail buffer 126 may also maintain the main memory address used for fail data storage. The capture buffer 128 is a buffer that temporarily stores capture data before final storage in the main memory 104. The capture buffer 128 may also maintain the main memory address used for capture data storage.

Figure 15:
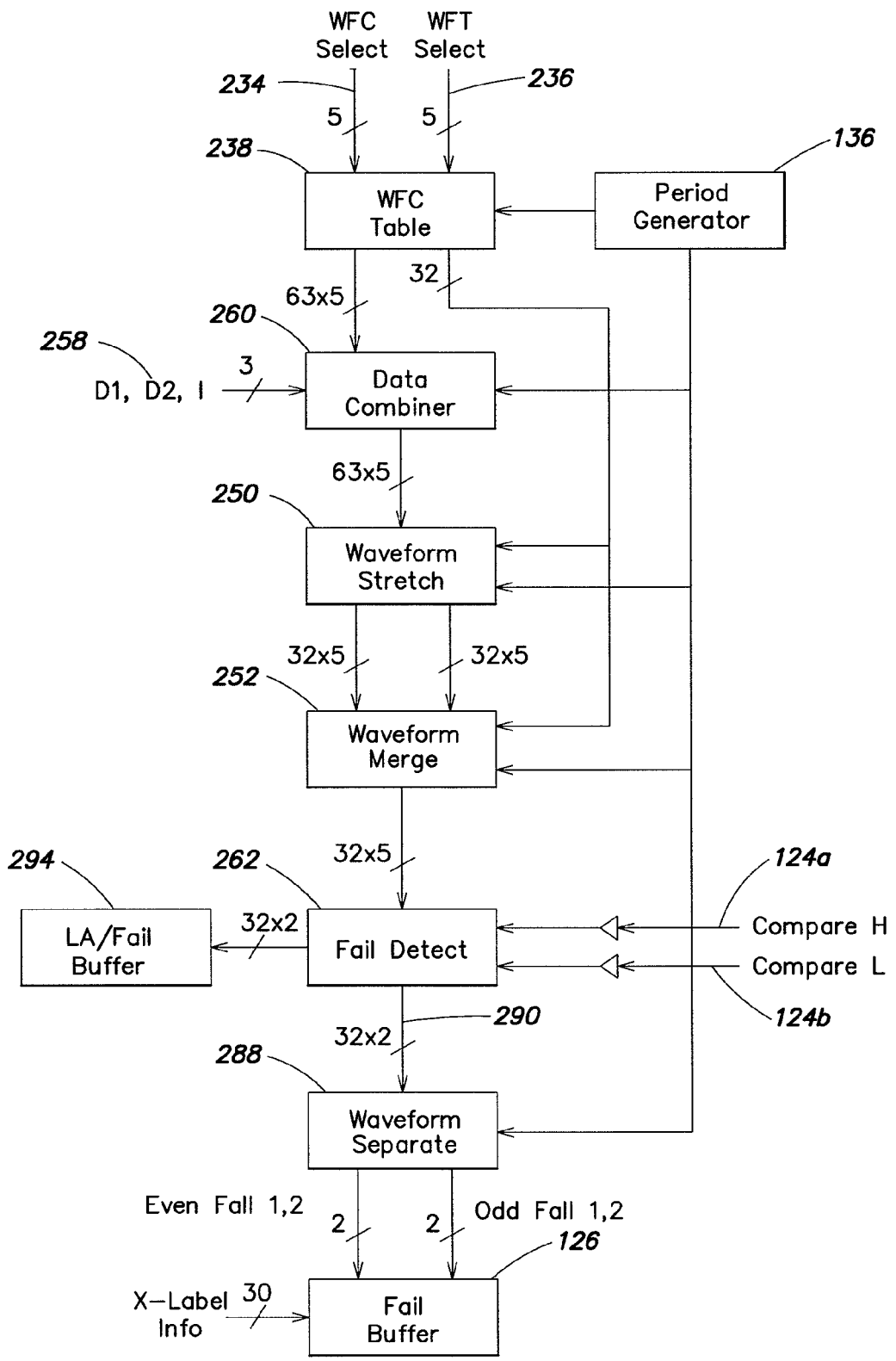
FIG. 15 is a block diagram of one example of compare SERDES circuitry according to aspects of the invention.

Referring to FIG. 15, there is illustrated a block diagram of one example of SERDES compare circuitry according to aspects of the invention. Similar to the SERDES Drive circuitry (illustrated in FIG. 6), inputs WFC select (on line 234) and WFT select (on line 236) from the vector memory are used to lookup waveform information in a WFT. The outputs from the WFT are used to determine which samples from the input SERDES 118 (see FIG. 1) are used for comparisons with expected values to detect failures. In one embodiment, fail data can be saved as well as information necessary to resolve which vector failed and the order of events that preceded the failure.

The STIL states for compare listed in Table 5:

TABLE 5

| State | Description |
|---|---|
| L | CompareLow, both comparators indicate low |
| H | CompareHigh, both comparators indicate high |
| X | CompareUnknown, ignore both comparators, also close window |
| T | CompareOff, above low comparator, below high comparator |
| V | Compare Valid, low comparator output same as high comparator output |
| l | CompareLowWindow, begin window looking for all L's |
| h | CompareHigh Window, begin window looking for all H's |
| t | CompareOffWindow, begin window looking for all T's |
| v | CompareValidWindow, begin window looking for all V's |

Consider the STIL state L, a compare to a low value. This state can be placed in an arbitrary waveform at any point in time. In the waveform based architecture according to at least some embodiments, a TIC (1 of up to 63) is assigned to perform the L comparison. Therefore, it is preferable to be able to represent within the waveform memory, enough information to tell the compare circuitry to make a test for the comparators to be low at that TIC. As waveforms get stretched (as discussed below) TICs may span multiple Ts's. However, in at least one example, the test may be done only at one, the first Ts.

Now consider the STIL state l, a window compare to a low value. This state can also be placed in an arbitrary waveform at any point in time. In the waveform based architecture according to at least some embodiments, a TIC may be defined where the window compare starts. Throughout the window, the goal is to continue the compare to L at every Ts, stopping the comparison at the X that closes the window. This goal may be achieved by introducing a compare to "p" or previous. In one example, this may be simply the XOR of a Ts sample to the adjacent (prior) Ts sample. If the software places a 1 at the beginning of a window, and place p's at all subsequent TICs in the waveform of this window, the result is a hard compare to a low at the first Ts of the TIC with the 1 in it, and compares to p at all remaining Ts's of the first TIC (if any), followed by compares to p for all Ts's of all remaining TICs of the window. The outputs of all the compares to p can be saved and stored with each vector.

As with the drive side, TIC codes may be created to implement L, H, X, T, and V. It may also be desirable to provide some ability to compare to pattern data bits D1 or D2. In addition, due to the way the waveform stretch may be implemented (discussed below), it may also be desirable to provide the ability to do window compares where all Ts's are used. One example of a complete list of compare TIC codes is shown in Table 6. In this example there are 16 TIC codes with 5 bits per TIC. The $5^{th}$ bit is used to select a fail position within the vector, either first or second position. This is used for double data rate modes where two fail positions may occur within the same vector and should be identified separately.

TABLE 6

| Mnemonic | CH | CL | Notes |
|---|---|---|---|
| L | 0 | 0 | Both comparator outputs low, first Ts of TIC only |
| H | 1 | 1 | Both comparator outputs high, first Ts of TIC only |
| X | X | X | Don't care |
| T | 0 | 1 | Below high comparator, above low comparator, first Ts of TIC only |
| V | Same | | Both comparators are the same, first Ts of TIC only |
| D1 | D1 | D1 | Both comparator outputs same as D1, first $T_s$ of tic only |
| D2 | D2 | D2 | Both comparator outputs same as D2, first $T_s$ of tic only |
| D1D2 | D1 | D2 | High comparator same as D1, Low comparator same as D2, first Ts of TIC only. Note: D1 = 0, D2 = 1 same as V. |
| l | 0 | 0 | Both comparator outputs low, first Ts of TIC only, any remaining Ts's replaced with compare to prior Ts |
| h | 1 | 1 | Both comparator outputs high, first $T_s$ of tic only, any remaining Ts's replaced with compare to prior Ts |
| p | p | p | Compare both comparators to those from prior Ts, for all Ts's in TIC. |
| t | 0 | 1 | Below high comparator, above low comparator, first $T_s$ of TIC only, any remaining Ts's replaced with compare to prior Ts |
| v | Same | | Both comparators are the same, first $T_s$ of tic only, any remaining $T_s$'s replaced with compare to prior $T_s$ |
| d1 | D1 | D1 | Both comparator outputs same as D1, first $T_s$ of tic only, any remaining $T_s$'s replaced with compare to prior $T_s$ |
| d2 | D2 | D2 | Both comparator outputs same as D2, first $T_s$ of tic only, any remaining $T_s$'s replaced with compare to prior $T_s$ |
| d1d2 | D1 | D2 | High comparator same as D1, Low comparator same as D2, first Ts of TIC only; any remaining $T_s$'s replaced with compare to prior Ts. Note: D1 = 0, D2 = 1 same as v. |

Figure 16:
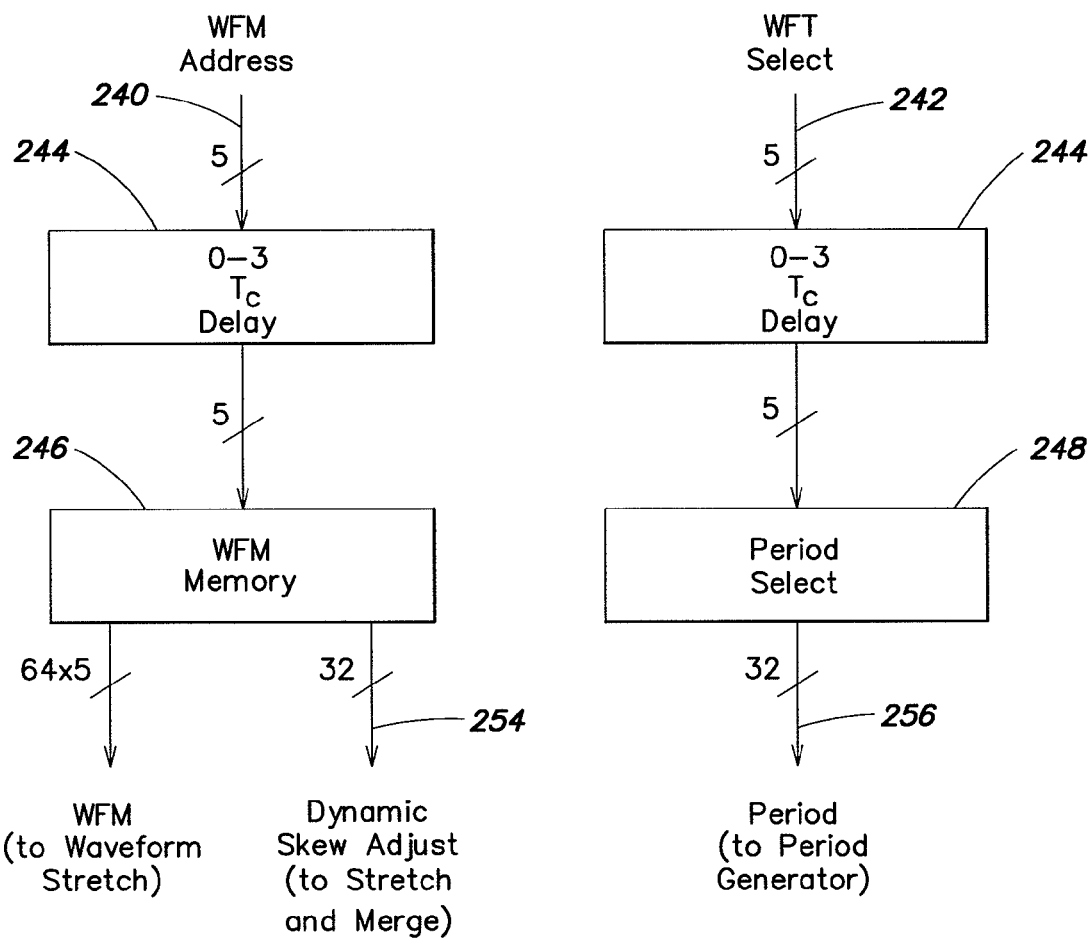
FIG. 16 is a block diagram of one example of waveform table remap and delay circuitry, according to aspects of the invention.

Referring to FIG. 16, there is illustrated a block diagram of one example of waveform table (WFT) circuitry 238 according to aspects of the invention. The WFT circuitry receives a waveform address (on line 240) and WFT select signal (on line 242) from the drive side waveform table circuits. As discussed above, the main memory provides vector information that controls the drive side and the receive side of the timing generator. The receive side, however, operates at a later time than does the drive side. This is due to the propagation delay of signals driven through pin electronics, pcb traces, connectors, etc., up to the DUT, through the DUT, back down similar paths to the pin electronics comparators and finally back to the timing generator. For proper operation of the timing generator, it may be preferable to compensate for this delay.

According to one embodiment, to compensate for this delay, two mechanisms may be used: coarse delay compensation in clock cycles (Tc), and fine delay compensation in Ts cycles. The actual total delay time may depend on the exact circuit implementation of the digital module and also on the DUT. However, in most instances, a delay of a few nanoseconds may be expected for the pin electronics (PE), about 2 feet of pcb trace in either direction to/from the DUT, and another few nanoseconds for the comparators. Therefore, a reasonable expected total round trip delay may be as much as about 20 ns.

In one example, the coarse delay compensation may be achieved by adding a variable number of Tc clock cycles to the pattern data, WFC and WFT selects. According to one embodiment, rather than duplicate the WFT remap memory, its output may instead be delayed along with the WFT select for period look-up. The coarse delay 244 is shown in FIG. 16. The fine delay compensation may be implemented as the initial value used on the compare side period generator 136 (see FIG. 15).

Figure 17:
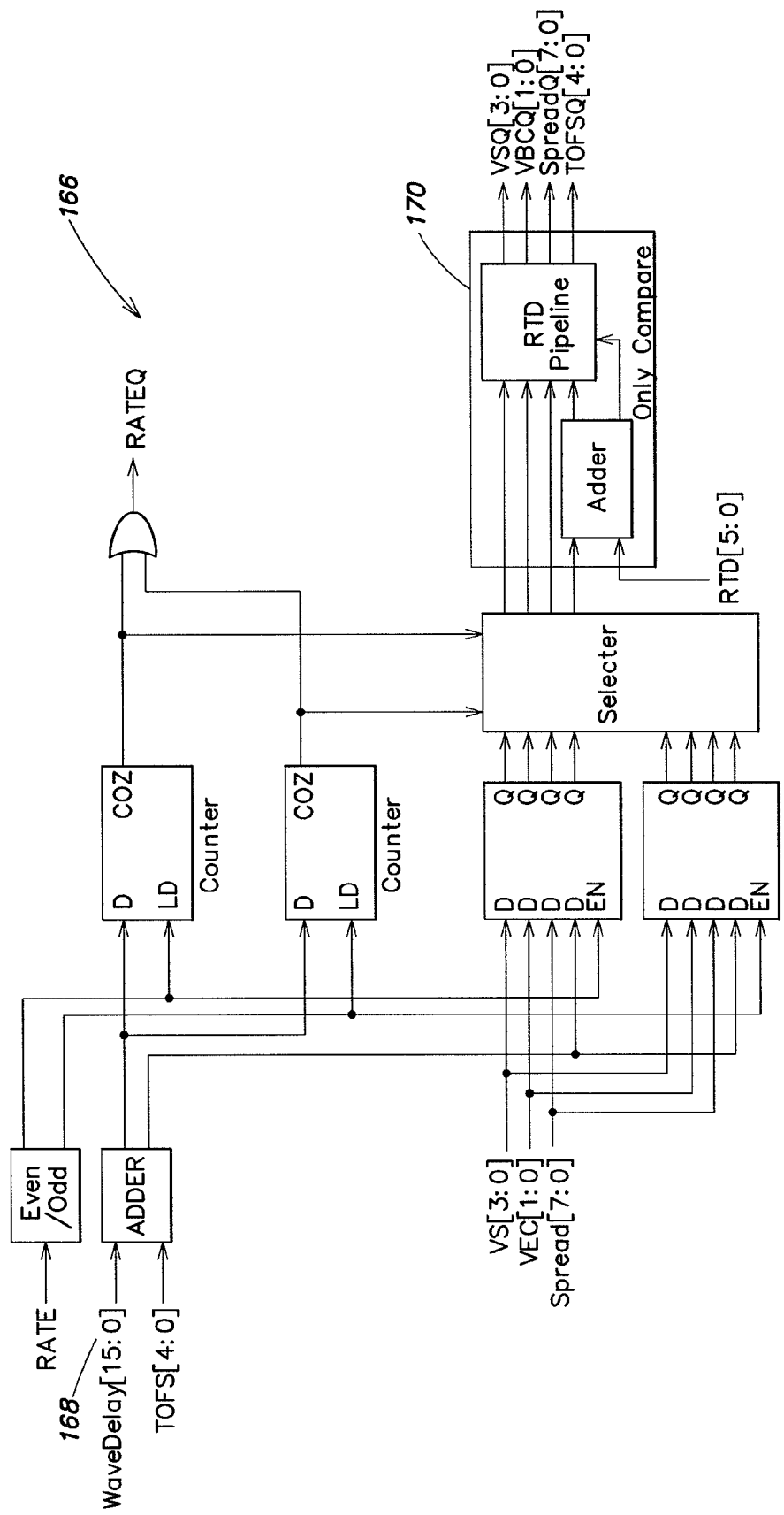
FIG. 17 is a block diagram of one embodiment of a wave delay circuit according aspects of the invention.

Delay compensation may also be implemented in the embodiment illustrated in FIG. 7. Referring to FIG. 7, according to one embodiment, the digital module may comprise a wave delay memory 164 and wave delay circuitry 166. The wave delay circuitry 166 and memory 164 may be used to compensate for different signal propagation delays through different components so as to "line up" the signals on the output lines to the pin. In one embodiment, a wave delay may be defined as a particular number of delay TICs from an initial time T0 to a start point of the waveform. In one embodiment, on the compare side, a round trip delay may also be added to the wave delay. Referring to FIG. 17, there is illustrated one example of wave delay circuitry 166. The wave delay signal on line 168 may be supplied by the wave delay memory 164. As shown in FIG. 17, round trip delay circuitry 170 may be provided to add a round trip delay to the compare waveform, as discussed above.

Referring back to FIG. 16, after the coarse delay 244 is added to the waveform address and WFT select signals, these signals are passed to a waveform memory 246 and period select circuit 248, respectively. Similar to what is done on the drive side, unused bits of the WFM 246 may be used to provide a 32 bit dynamic skew adjust value (on line 254) per WFC that is sent to the compare side waveform stretch circuit 250 and waveform merge circuit 252 (see FIG. 15). The period select circuit 248 provides a period signal (on line 256) to the period generator 136.

Referring again to FIG. 15, the WFM 238 outputs are combined (in data combiner 260) with pattern data bits D1, and D2, and an I (fail ignore) bit to drive the logic where actual comparisons are made to the outputs of the receive SERDES. The pattern data bits and fail ignore bit are provided on line 258 from the main memory. One example of compare side data combiner logic is described in Table 7 below. In this example, the fail position select bit chooses whether the TIC code is used for fail position 1 or fail position 2.

TABLE 7

| Tic Code | I | Enable[1:0] | CHval | CLval | |
|---|---|---|---|---|---|
| All | 1 | None | X | X | |
| L | 0 | HL | 0 | 0 | |
| H | 0 | HL | 1 | 1 | |
| X | 0 | None | X | X | |
| T | 0 | HL | 0 | 1 | |
| V | 0 | Valid | X | X | |
| D1 | 0 | HL | D1 | D1 | |
| D2 | 0 | HL | D2 | D2 | |
| D1D2 | 0 | HL | D1 | D2 | |
| D1D2 | 0 | Valid | X | X | D1 = 1, D2 = 0 |
| l | 0 | HL | 0 | 0 | |
| h | 0 | HL | 1 | 1 | |
| p | 0 | Previous | X | X | |
| t | 0 | HL | 0 | 1 | |
| v | 0 | Valid | X | X | |
| d1 | 0 | HL | D1 | D1 | |
| d2 | 0 | HL | D2 | D2 | |
| d1d2 | 0 | HL | D1 | D2 | |
| d1d2 | 0 | Valid | X | X | D1 = 1, D2 = 0 |

The output of the data combiner 260 may be provided to waveform stretch circuitry 250. The waveform stretch circuitry 250 is similar in function to that used in the drive side. However, when stretched, a drive side waveform has its events (TICs) duplicated by the stretch rate. By contrast, when stretched, a receive (compare) waveform has its events spaced out, not replicated. Table 8 illustrates an example of compare side waveform stretch. It should be noted that "S" in Table 8 refers to a "space." A space disables all comparisons except a compare to previous, which is used in window compares. Thus, if the source bit for an S is H, L, T, or V, then S=X. If the source bit for an S is h, l, t, or v, the S=p.

TABLE 8

| Output Register Bit | Source X1 | Source X2 | Source X4 | Source X8 | Source X16 | Source X32 | Mux required |
|---|---|---|---|---|---|---|---|
| 0 | 0 | 0 | 0 | 0 | 0 | 0 | None |
| 1 | 2 | S | S | S | S | S | 2:1 |
| 2 | 4 | 4 | S | S | S | S | 2:1 |
| 3 | 6 | S | S | S | S | S | 3:1 |
| 4 | 8 | 8 | 8 | S | S | S | 2:1 |
| 5 | 10 | S | S | S | S | S | 3:1 |
| 6 | 12 | 12 | S | S | S | S | 3:1 |
| 7 | 14 | S | S | S | S | S | 4:1 |
| 8 | 16 | 16 | 16 | 16 | S | S | 2:1 |
| 9 | 18 | S | S | S | S | S | 3:1 |
| 10 | 20 | 20 | S | S | S | S | 3:1 |
| 11 | 22 | S | S | S | S | S | 4:1 |
| 12 | 24 | 24 | 24 | S | S | S | 3:1 |
| 13 | 26 | S | S | S | S | S | 4:1 |
| 14 | 28 | 28 | S | S | S | S | 4:1 |
| 15 | 30 | S | S | S | S | S | 5:1 |
| 16 | 32 | 32 | 32 | 32 | 32 | S | 2:1 |

TABLE 8-continued

| Output Register Bit | Source X1 | Source X2 | Source X4 | Source X8 | Source X16 | Source X32 | Mux required |
|---|---|---|---|---|---|---|---|
| 17 | 34 | S | S | S | S | S | 3:1 |
| 18 | 36 | 36 | S | S | S | S | 3:1 |
| 19 | 38 | S | S | S | S | S | 4:1 |
| 20 | 40 | 40 | 40 | S | S | S | 3:1 |
| 21 | 42 | S | S | S | S | S | 4:1 |
| 22 | 44 | 44 | S | S | S | S | 4:1 |
| 23 | 46 | S | S | S | S | S | 5:1 |
| 24 | 48 | 48 | 48 | 48 | S | S | 3:1 |
| 25 | 50 | S | S | S | S | S | 4:1 |
| 26 | 52 | 52 | S | S | S | S | 4:1 |
| 27 | 54 | S | S | S | S | S | 5:1 |
| 28 | 56 | 56 | 56 | S | S | S | 4:1 |
| 29 | 58 | S | S | S | S | S | 5:1 |
| 30 | 60 | 60 | S | S | S | S | 5:1 |
| 31 | 62 | S | S | S | S | S | 6:1 |

In one embodiment, there may be provided the capability to capture data per vector. This capture data may be stored in the capture buffer 128 (see FIG. 1). Each WFC may specify up to two capture locations per vector. In one example, the capture location may be specified as a 6 bit TIC value. Thus, the WFC may also contain two 6-bit numbers that indicate the capture TIC positions. In one example, "legal" TIC values are 0-62, with 63 being used to indicate no capture. In those cases where the waveform has been stretched, some stretching may also need to be done on the capture position. This is not shown in Table 8 above. In one example, data capture may always occur at the first Ts of the specified TIC. Thus, the final (after stretching) Ts position may be used to capture a sample from the SERDES, this sample then being fed to the capture buffer 128. In one example, both the Compare H and Compare L SERDES outputs (124*a*, 124*b* in FIG. 15) may be sampled and stored, giving the complete state of the pin at that point. In the capture buffer, the samples may be combined into a reasonable size (this size potentially being variable and therefore may depend on factors such as the size of the buffer, available memory etc.) before storage in the main memory 104.

In another embodiment, the capture buffer may also be used to store a predetermined number of system clock cycles worth of Ts samples, when the digital module is operating in a mode referred to as "logic analyzer mode." The logic analyzer mode is discussed further below.

Referring again to FIG. 15, even and odd stretched waveforms may be fed to waveform merge circuitry 252. In the waveform merge circuitry 252, the even and odd stretched waveforms are combined into a single 32×5 bit stream and fed to a fail detect block 262. In one example, the waveform merge circuit 252 may be substantially the same as the waveform merge circuit 190 used in the drive side (see FIG. 11) except that stretching may be done on 5 bits instead of 2.

Figure 18:
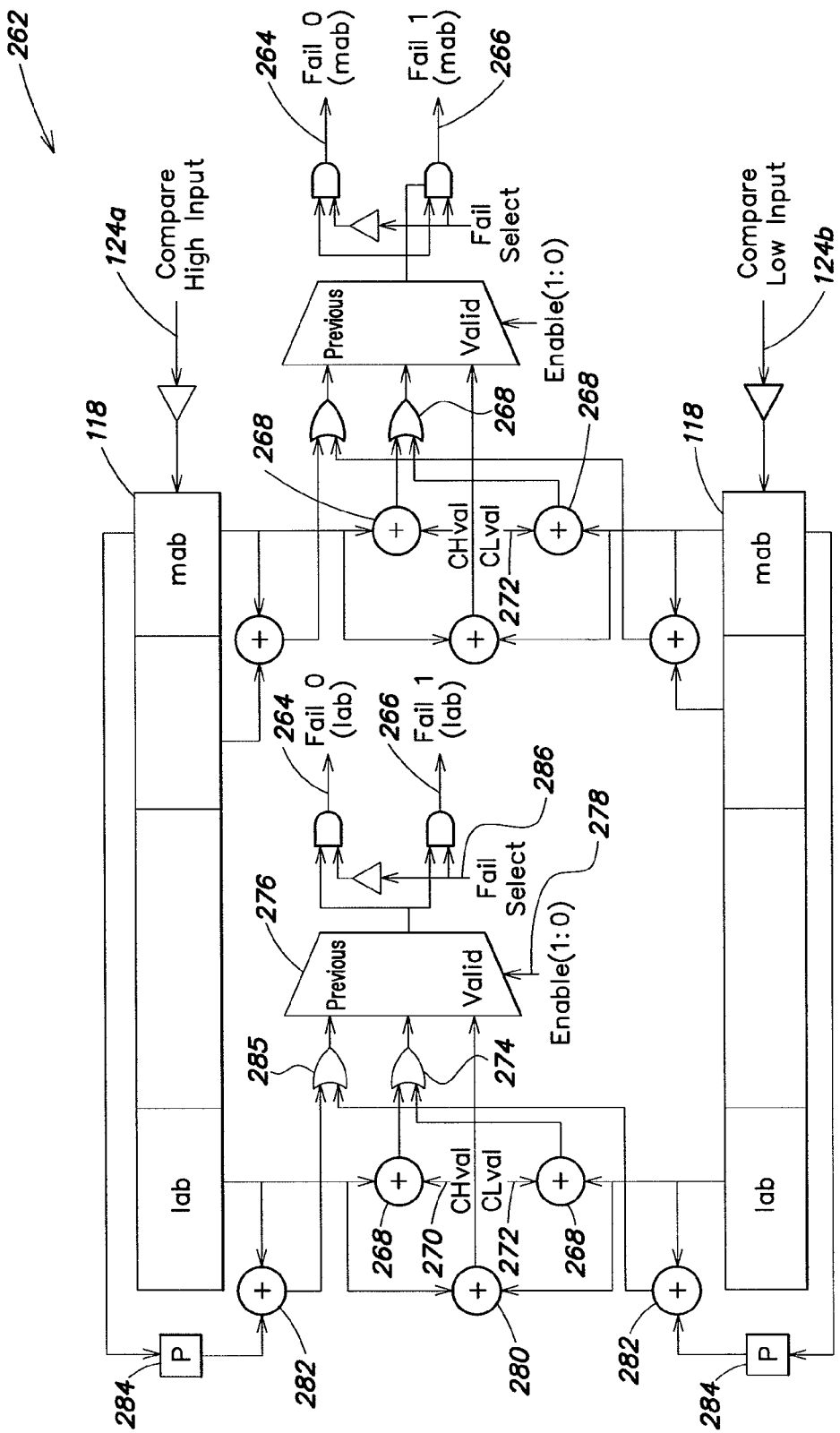
FIG. 18 is a block diagram of one embodiment of a fail detect circuit according to aspects of the invention.

Referring to FIG. 18, there is illustrated a block diagram of one example of fail detect circuitry 262 according to aspects of the invention. In the illustrated embodiment, the fail compare logic is composed of 32 repeated blocks, one for each bit from the receive SERDES. Only the circuitry for the least significant bit (lsb) and most significant bit (msb) is shown in FIG. 18; however, the circuitry would be repeated for each bit of the SERDES. Each logic block has the ability to compare (via an XOR function, for example) to specific values, to a "valid" indicator, or to the previous SERDES bit. In the last case, for the lsb of the SERDES, comparison may be made to the previous msb from the clock cycle before. Depending on the fail position select (provided on line 286), each bit can generate a Fail 0 output 264 or a Fail 1 output 266. These outputs may be accumulated throughout the vector period and recorded at the end of the period.

Still referring to FIG. 18, in one embodiment, there are two SERDES inputs, namely from the high comparator (CH) 124*a* and low comparator (CL) 124*b*. Each tap of each SERDES 118 (there being 32 taps on each of two SERDES) has an XOR gate 268 tied to it. The other input to each XOR gate 268 comes from a bit from the data combiner 260, CHval (on line 270) or CLval (on line 272), "val" being short for value. For each tap, these two XOR gates are OR'ed together in an OR gate 274 and fed to one input of a multiplexer 276. This input, the HL input, is selected when the enable[1:0] signal provided on line 278 is set to HL. Each tap of each SERDES 118 also feeds an XOR gate 280 whose other input comes from the corresponding tap on the other SERDES, so as to allow an XOR of a tap on the CL SERDES with the same tap on the CH SERDES. This XOR gate 280 feeds a second input of the multiplexer 276. This second input, labeled "valid" is selected when the enable[1:0] signal on line 278 is set to "Valid."

Finally, each tap of the two SERDES 118 feeds another XOR gate 282 whose other input comes from the same SERDES' previous tap (toward lsb) 284. For tap 0, the compare is done to the most recent tap 31 from the previous clock cycle (Tc). The outputs of these XOR gates 282 feed an OR gate 284 whose other input comes from a similar XOR gate 282 from the other SERDES, as shown. The OR gate 284 feeds a third input of the multiplexer 276. This third input, labeled previous, is selected when the enable[1:0] signal on line 278 is set to "Previous." In one example, the multiplexer may have a fourth input (not shown) that is driven with 0, and selected when the enable[1:0] signal on line 278 is set to "none." The output of the multiplexer 276 indicates a failure to the Ts level because each bit from the SERDES (clocked in each Ts) provides a fail compare. In one example, the indications from all bits (all Ts) can be OR'ed to indicate failure on a vector level.

Referring again to FIG. 15, the output of the fail detect logic 262 may be fed on line 290 to waveform separate circuitry 288. Analogous to the waveform merge 190 on the drive side (see FIG. 6), the vectors on the compare side may need to be separated from one another such that any fails detected within each vector may be recorded individually. As discussed above, successive vectors are identified as even or odd. Within any given clock cycle (Tc), outputs from the fail detect logic 262 may be all from an even vector, all from an odd vector, or partially even and partially odd, which can be further differentiated by whether odd comes first or even comes first within that clock cycle. Accordingly, waveform separate circuitry 288 may process the signals received from the fail detect logic 262 to separate the even and odd vectors.

Figure 19:
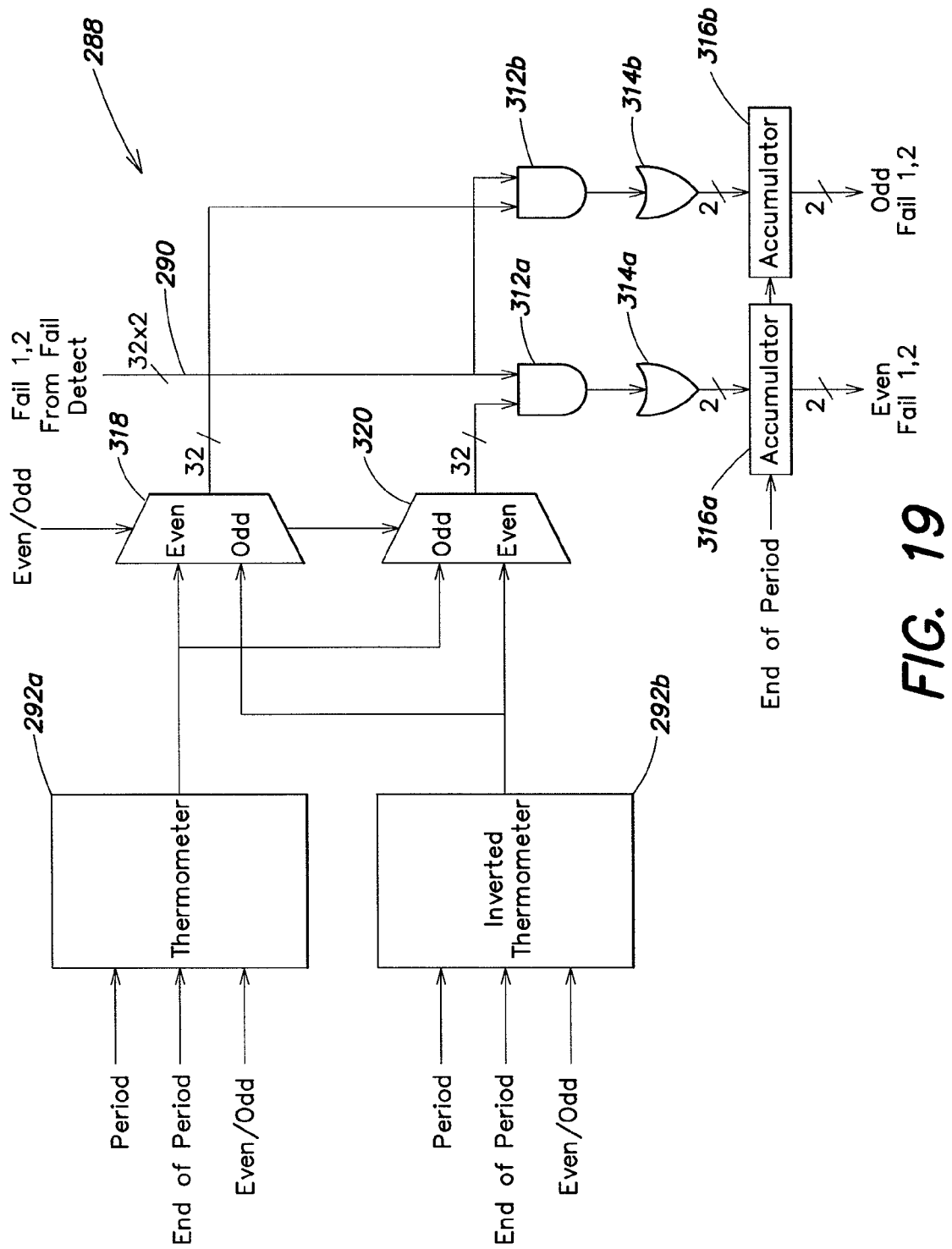
FIG. 19 is a block diagram of one example of waveform separate circuitry according to aspects of the invention.

Referring to FIG. 19, there is illustrated a block diagram of one example of a waveform separate circuit 288 according to aspects of the invention. During clock cycles that are partially even and odd, two thermometer type circuits 292a, 292b are used to mask off the undesired bits from the fail detect signal provided on line 290. During these cycles that are partially even and odd, one multiplexer, for example, the top multiplexer 318 selects the normal thermometer output, and the other multiplexer 320 selects the inverted thermometer output. The output from the top multiplexer 318 will contain a mask to select only the Ts bits that belong to an odd vector. This output is fed to a set of AND gates 312b (one per Ts) that allow only the Ts outputs from the fail detect logic that belong to the odd vector to be ORed by the OR gate 314b below. An accumulator 316b keeps track of any failures that occur across system clock cycles. Similarly, the multiplexer 320 will contain a mask to select only the Ts bits that belong to an even vector. Its output is fed to a similar set of AND gates 312a to select only the Ts bits that belong to an even vector, and those are ORed in OR gate 314a and accumulated by accumulator 316a. At the end of the vector period, any accumulated fail is written along with information that allows the failing vector to be identified to the fail buffer 126 (see FIG. 1 or 15) where it may be queued for transfer and storage in main memory 104 (see FIG. 1).

As discussed above, in at least some embodiments, the digital module may provide for a "logic analyzer mode." In these embodiments, the capture buffer 128 (see FIG. 1) may be a dual purpose buffer used for logic analyzer mode and for storing capture data. In another example, rather than using the capture buffer 128 for the logic analyzer mode, the fail buffer 126 may be used. In this case, the fail buffer would be a dual purpose buffer. The following discussion will refer to a logic analyzer buffer 294 (see FIG. 15) and it is to be appreciated that this may be the fail buffer 126, the capture buffer 128 or a separate logic analyzer buffer may be provided in addition to the capture and fail buffers.

In one example, the logic analyzer buffer 294 may be a circular buffer that continuously stores raw SERDES inputs (32×2) every Tc. There may be provided one logic analyzer buffer per pin channel. In one example, each logic analyzer buffer 294 may be 128×32×2 in size. The logic analyzer buffer may be triggered in at least two modes, namely "first fail mode" in which the first fail event is detected, or a "pattern control mode" in which the buffer is triggered by an operation bit plus a statically programmed clock cycle count. When a fail occurs, approximately half the logic analyzer buffer may be allowed to be written beyond the fail position. Thus, the fail position may be approximately at the middle of this buffer. In one example, all channels may store with the same fail trigger. Fails may be detected at the end of a vector period, in which case, the period generator remainder may be from 0 to 31. This remainder may be stored at the instant of the fail detect, such that the vector boundary where the fail occurred is known within the logic analyzer buffer. In some examples where the vector period is very long (e.g., one the order of several milliseconds), a static count of system clock cycles Tc may be used to select a specific clock cycle within the period in which to trigger the logic analyzer mode. Once the data is stored within the logic analyzer buffer, it may be read out (for example, on a dedicated logic analyzer output of the digital module), or may be transferred to main memory at the end of the test cycle so as to not consume main memory bandwidth for the logic analyzer mode.

As discussed above, in at least some embodiments, the SERDES may be very high speed SERDES which may have Ts of approximately 234 ps. However, in some cases, the digital module may include slower SERDES having a longer Ts. Alternatively, as technology advances, it may become preferable to have a higher Ts resolution (i.e., shorter Ts) than current SERDES may provide. In these cases, a system may be provided to shift and multiplex several SERDES together to provide a drive waveform at lines 122a, 122b (see FIG. 1) with a shorter effective Ts.

Figure 20:
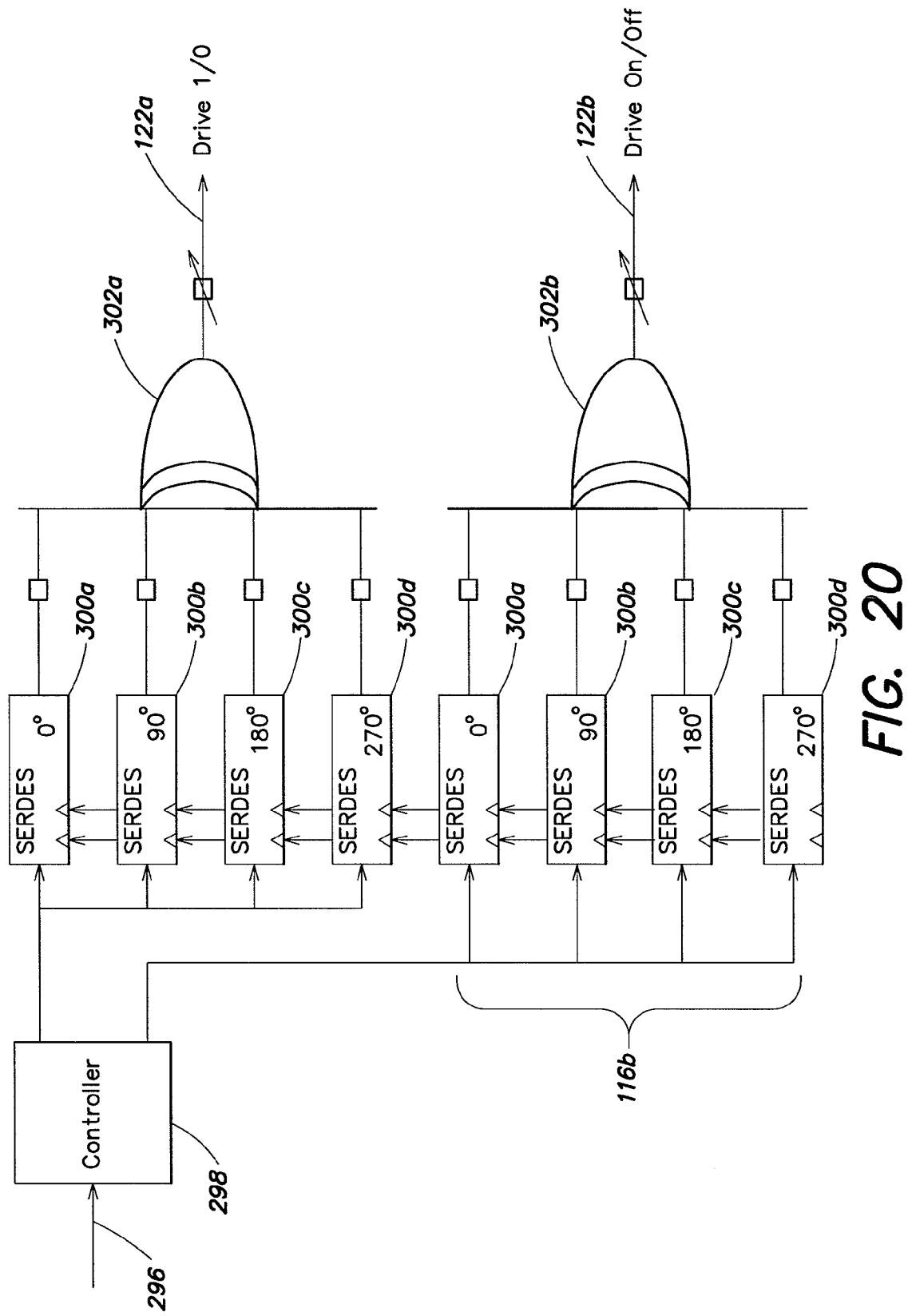
FIG. 20 is a block diagram of one example of SERDES multiplexing circuitry according to aspects of the invention.

Referring to FIG. 20, there is illustrated a block diagram of one example of such SERDES multiplexing circuitry. In the illustrated example, each of the SERDES 116a, 116b (see FIG. 7) comprises four individual SERDES 300a, 300b, 300c and 300d that combine to provide the outputs on lines 122a, 122b. Each of these individual SERDES may be 4-bit SERDES so as to make up the total 32-bit SERDES 116. However, it is to be appreciated that the invention is not limited to the use of 4-bit SERDES as any suitable number of bits may be used, and also the SERDES need not be grouped into fours, but other groupings may also be acceptable. A controller 298 may receive the drive waveform signal on line 296 (from, for example, the waveform merge circuitry 190 in FIG. 6 or the drive circuitry 158 in FIG. 7). The controller 298 may split up each of the drive H/L signal and the drive enable signal (supplied ultimately on lines 122a and 122b, respectively) into four sub-signals, one for each of the SERDES 300a, 300b, 300c and 300d. As illustrated in FIG. 20, the four SERDES 300a, 300b, 300c and 30d may each be phase shifted by 90 degrees from one another. Thus, SERDES 300a may have a phase shift of 0 degrees, SERDES 300b a phase shift of 90 degrees, SERDES 300c a phase shift of 180 degrees and SERDES 300d a phase shift of 270 degrees. The phase-shifted outputs from each of the four SERDES may be interleaved via XOR gates 302a and 302b such that the serial output on lines 122a and 122bb comprise sequential bits from each SERDES in the group. In this manner, the drive signal may have an effective timing that is four times faster than the timing of any individual SERDES 300a, 300b, 300c or 300d.

As discussed above in reference to FIG. 1, operation of the digital module according to aspects of the invention may be controlled via information supplied from the main memory 104. In addition, results from the tests performed by the ATE on DUTs may be recorded in the main memory 104. Operation of the main memory, communication therewith and other memory components is now discussed in more detail.

Figure 21:
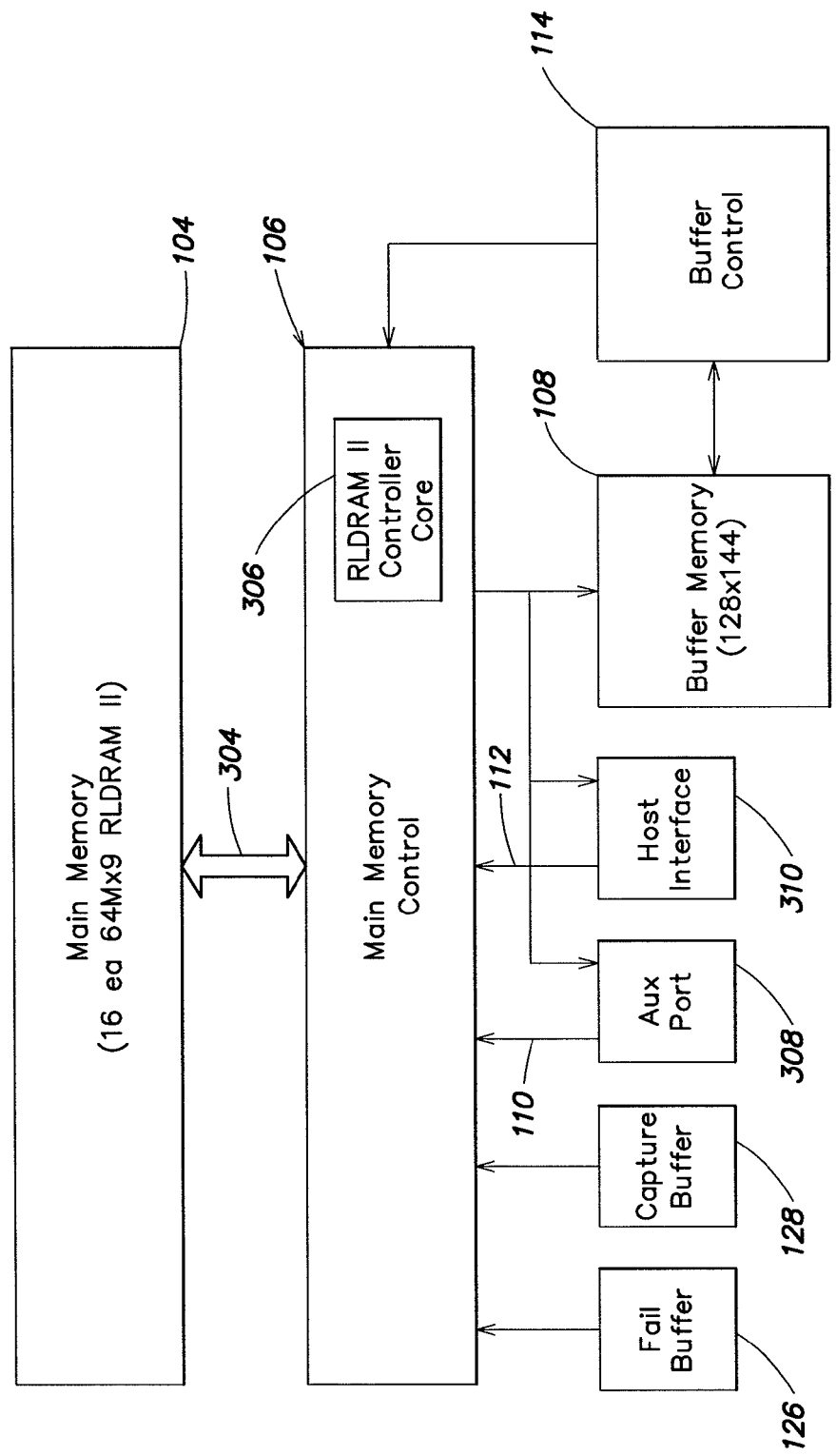
FIG. 21 is a block diagram of one example of a memory subsystem according to aspects of the invention.

Referring to FIG. 21, there is illustrated a block diagram of one example of a memory subsystem according to aspects of the invention. The memory subsystem may comprise the main memory 104, the main memory control 106, the buffer memory 108 and buffer memory control 114. To test a DUT, a series of test and compare vectors (referred to as a pattern) may be read from the main memory 104 into the buffer memory 108. In one example, pattern data may be read from the main memory 104 to fill the buffer memory 108 from which vectors are decoded and executed. As the buffer memory 108 fills up, the flow of data from the main memory 104 is turned off, and as the buffer memory 108 begins to empty, the main memory 104 is again read.

Due to memory characteristics, there may be some inherent latency in executing some memory operations, such as a JUMP. It takes time to decode the JUMP instruction, tell the memory controller that it should begin reading at a new location, and wait for data from that location. Also, some operations such as a refresh may be in progress when the JUMP is decoded, and it takes time to wait for that operation to complete. In one example, latency for a JUMP is expected to be approximately 12 vectors. The latency of JUMPing in main memory 104 may restrict the size of a loop of vectors that can be executed from main memory 104. If the latency is 12 vectors, this essentially becomes the minimum loop size. To allow loops that are smaller than this, buffer control 114 may be used to re-read the buffer memory 108 as required, effectively executing small loops directly from the buffer memory 108. The latency of JUMPing may also affect how often a JUMP type instruction can be placed in vector memory.

In one example, the main memory 104 may be composed of a number (e.g., 16) of 64M×9 RLDRAM II memories per FPGA 102 (see FIG. 1). However, it is to be appreciated that the invention is not so limited and other memory types, including DDR, DDR2 and DDR3, may be used. In one example, two FPGAs may be used together to provide a full 16 bit sequencer/timing generator resource. The per channel (pin) data may reside in one memory chip per channel. Even though the per vector (control) data is common between FPGAs, each FPGA may have different write activities (fail and capture) preventing 100% synchronized memory controllers. Therefore, in at least one embodiment, the control data may be replicated for each FPGA.

According to at least some embodiments, the data bus 304 may be bi-directional for full read/write functionality. This means that not only are patterns stored in main memory 104, but main memory 104 can store fail information, capture data, and can even be a scratch area to be used for any post processing of capture data prior to sending data back to the host ATE. In one example, the main memory 104 may be capable of operating with a clock twice the frequency of Tc (e.g., nominally 267 MHz), and with DDR style input and output data, such that the peak data rate to/from the memory is 4× the maximum vector rate. Using careful management and the buffer memory 108, reading vector data, writing fail and capture data, and executing required refresh commands may all be accomplished with an uninterrupted pattern presentation (i.e., uninterrupted testing of a DUT) at 133 MHz.

Still referring to FIG. 21, the main memory control 106 provides the direct interface to the main memory 104. The main memory control may include a RLDRAMII controller core 306. The main memory control 106 may comprise machinery to perform the following: reading the main memory with a burst rate of 4× the maximum vector rate (in one example, 133M vectors per second); writing the main memory with a burst rate of 4×; refresh; memory initialization; arbitrate reading and writing between the various sources/destinations; bank management; and providing hardware support for fill, clear, CRC checks, etc.

According to one embodiment, each FPGA 102 (see FIG. 1) may include a buffer memory 108. In one example, each buffer memory 108 may be 128×144 in size within the FPGA. The buffer memory 108 is used in conjunction with the main memory 104 to allow constant data flow to the vector circuitry while allowing the burst nature of the main memory 104 to exist. In other words, in at least some examples, the main memory 104 may be read in "burst" format with a specified burst length. However, the vector (drive and compare) circuitry may expect to receive data in per-vector format, not in burst format that may contain several vectors. Therefore, the buffer memory 108 may be used to receive bursts of data from the main memory and read the data out vector by vector. In one example, the buffer memory 08 may be sufficiently large that it can be refilled before emptying after any JUMP type operation and after any necessary refresh operations have been executed along with any write operations.

Still referring to FIG. 21, the buffer memory control 114 may respond to a "fullness" indication from the buffer memory 108 to request additional data from main memory 104 as the buffer memory 108 becomes empty. The buffer memory control 114 may also act to stop the flow of data from main memory 104 as the buffer memory 108 becomes full. In one example, the buffer memory control 114 may contain logic to assist with memory JUMPs and Small Loops, and may also contain stacks necessary for nesting of loops and performing procedure calls.

As shown in FIG. 21, an auxiliary port 308 and host interface 310 may be coupled to the main memory 104 via the main memory control 106 and data bus 304. The host interface 310 may supply a bi-directional path for the host computer to read and write main memory 104. The auxiliary port 308 may provide a bi-directional port for various uses, such as, for example, for an on-board capture processor to gain access to data and scratch pad use.

As discussed above, according to at least some embodiments, fail data may be recorded in the fail buffer 126 and provided to the main memory. In one example, fail reporting may be done by writing two types of records into the fail buffer 126. The first record type is an X-Label record. This record is simply the X-Label encountered within a vector zero filled to make a 36 bit value. The second record type is a Fail record. This record comprises, for example, 16 bits of fail information (fail 1 and fail 2 for each of 8 channels) and a 20 bit count. The count is reset each time an X-Label record is written and incremented for every vector, so the count plus the most recent X-Label may provide exact failure position.

In one example, each record may be 36 bits. Each FPGA may see a 144 bit wide main memory 104, with a burst length (BL) equal to four. Records may be gathered and written 16 at a time (4 across, 4 deep). In one example, at most two records may be created each Tc (an X-Label and a Fail record), so fail memory updates (to main memory) may occur at most once every 8 Tcs. In this example, a fail buffer 126 that is approximately 32×36 may be used for fail data to prevent losses before transfer to main memory 104. Portions of main memory may be allocated for fail data. Configuration of the fail portion of main memory may specify, for example, a starting ram address, and the size of memory to be allocated. In some examples, options may also be provided for stopping when reaching the end of the fail buffer, or wrapping around and overwriting previous data.

As discussed above, in at least some embodiments, each (or some) FPGA of the digital module may also comprise a capture buffer 128. In one example, capture data may comprise at most 4 bits per channel (two capture positions per vector containing both high and low comparator values). With 8 channels per FPGA, capture data can be 32 bits maximum per Tc. It is to be appreciated however, that the invention is not limited to any specific number and, in particular, more or fewer channels may be provided per FPGA and more or fewer bits may be used. Similar to the way fail data is written, capture data may be written 16 at a time (4 across and 4 deep). In one example, capture data may need to be written, at most, once every 16 Tcs. Therefore, like the fail buffer 126, a capture buffer size large enough memory to hold 32 capture records may be sufficient.

In summary, at least some aspects and embodiments of the invention are directed to a digital module for waveform and timing generation and measurement in ATE. High SERDES (or other shift registers) may be used to digitally draw a test waveform by receiving parallel input data from a memory device on the digital module and converting it to a serial waveform to stimulate a pin to which a DUT may be coupled. The waveform may be defined in terms of TICs, rather than by using a strobe as in the case in conventional ATEs. The TICs are independent of the waveform, since they are defined by a system clock. By using SERDES elements to produce the waveform, improved jitter and linearity (because the SERDES propagation delay is constant) may be achieved compared to conventional waveform generation. In addition, high speed SERDES may also be used to receive (in serial form) a response waveform from a DUT and convert it to parallel data for high speed processing. Again, because the drive waveform and the compare waveforms that may be used analyze the response of the DUT may be defined using TICs, more detail may be captured in the waveform and thus a single waveform may be used to perform multiple tests on the DUT in a single vector. For example, the same waveform may be used to test a device for the transition from high-to-low as well as the transition from low-to-high. Using conventional strobe techniques, these two tests would be performed using two different waveforms in different vectors. By digitally drawing the waveform in TICs and using the SERDES, enhanced functionality may be achieved. Furthermore, as noted above, a digital module according to the invention may be implemented in an FPGA, which may be significantly more flexible and inexpensive to develop than is an ASIC used in conventional ATE. Thus, a digital module according to aspects of the invention may facilitate development of ATE that is lower cost, scalable and supports quick prototyping of new measurement solutions.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A waveform generation and measurement module in automated test equipment comprising:
   a memory device that contains vector information characterizing a test waveform, the vector information including a waveshape of the test waveform and a frequency of the test waveform;
   a first plurality of shift registers that receive the vector information from the memory device as parallel data and produce multiple serial output data streams that in combination produce the test waveform having the waveshape; and
   a second plurality of shift registers that receive in serial format a response waveform from a device under test and produce as an output, parallel data corresponding to the response waveform.

2. The waveform generation and measurement module as claimed in claim 1, wherein the first and second plurality of shift registers each comprises at least one serializer/deserializer component.

3. The waveform generation and measurement module as claimed in claim 2, wherein the test waveform is defined as a plurality of TICs, each TIC corresponding to at least one bit position within the test waveform.

4. A waveform generation and measurement module in automated test equipment comprising:
   a memory device that contains vector information characterizing a test waveform;
   a first plurality of shift registers that receive the vector information from the memory device in parallel format and produce a serial output corresponding to the test waveform; and
   a second plurality of shift registers that receive in serial format a response waveform from a device under test and produce as an output, parallel data corresponding to the response waveform;
   wherein the first and second plurality of shift registers each comprises at least one serializer/deserializer component;
   wherein the test waveform is defined as a plurality of TICs, each TIC corresponding to at least one bit position within the test waveform; and
   wherein each TIC has a duration that is greater than or equal to one clock cycle of the serializer/deserializer component.

5. The waveform generation and measurement module as claimed in claim 4, further comprising a data combiner;
   wherein the data combiner receives pattern data from the memory device; and
   wherein the data combiner is constructed and arranged to combine the pattern data with the vector information characterizing the test waveform to produce the test waveform.

6. The waveform generation and measurement module as claimed in claim 4, wherein the vector information specifies a vector period.

7. The waveform generation and measurement module as claimed in claim 6, further comprising a period generator constructed and arranged to generate the vector period.

8. The waveform generation and measurement module as claimed in claim 4, wherein the memory device contains compare vector information characterizing a compare waveform.

9. The waveform generation and measurement module as claimed in claim 4, wherein the waveform generation and measurement module is implemented as a field programmable gate array.

10. A waveform generation and measurement module in automated test equipment comprising:
    a memory device that contains vector information characterizing a test waveform, the test waveform being defined as a plurality of TICs, each TIC corresponding to at least one bit position within the test waveform;
    a first plurality of shift registers that receive the vector information from the memory device in parallel format and produce a serial output corresponding to the test waveform, the first plurality of shift registers comprising at least one serializer/deserializer component;
    a second plurality of shift registers that receive in serial format a response waveform from a device under test and produce as an output, parallel data corresponding to the response waveform, the second plurality of shift registers comprising at least one serializer/deserializer component; and
    a waveform stretch circuit, the waveform stretch circuit being constructed and arranged to replicate each TIC, such that each TIC has a duration that is at least two clock cycles of the serializer/deserializer component.

11. A waveform generation and measurement module in automated test equipment comprising:
    a memory device that contains vector information characterizing a test waveform and compare vector information characterizing a compare waveform;

a first plurality of shift registers that receive the vector information from the memory device in parallel format and produce a serial output corresponding to the test waveform; and a second plurality of shift registers that receive in serial format a response waveform from a device under test and produce as an output, parallel data corresponding to the response waveform; and a fail detect circuit that receives the compare waveform and the response waveform and is constructed and arranged to compare the response waveform with the compare waveform, bit by bit.

12. The waveform generation and measurement module as claimed in claim 11, wherein the fail detect circuit is constructed and arranged to generate a fail record based on the comparison of the response waveform with the compare waveform.

13. The waveform generation and measurement module as claimed in claim 12, further comprising a fail buffer, the fail buffer being constructed and arranged to receive and store the fail record.

14. A method of waveform generation in automated test equipment comprising:

providing digital data in a parallel format to a first plurality of shift registers; and serially shifting out the digital data from the first plurality of shift registers to produce a test waveform;

wherein providing the digital data includes providing a digital waveform comprising a plurality of TICs, each TIC having a duration that is equal to at least one shift register clock cycle.

15. The method as claimed in claim 14, further comprising stretching the digital waveform such that each TIC has a duration that is equal to at least two shift register clock cycles.

16. The method as claimed in claim 14, further comprising:

receiving with a second plurality of shift registers a response waveform in serial format; and converting the response waveform to parallel format output data.

17. The method as claimed in claim 16, further comprising:

comparing the output data to a compare waveform; and generating fail data based on the comparing.

18. The method as claimed in claim 17, further comprising storing the fail data.

19. The method as claimed in claim 17, wherein comparing the output data to the compare waveform includes performing a bit by bit comparison.

* * * * *